United States Patent
Dimitriadis

(10) Patent No.: US 9,368,347 B2
(45) Date of Patent: Jun. 14, 2016

(54) APPARATUS AND METHOD FOR IRRADIATING

(71) Applicant: Thomas Christ Dimitriadis, Gardenerville, NV (US)

(72) Inventor: Thomas Christ Dimitriadis, Gardenerville, NV (US)

( * ) Notice: Subject to any disclaimer, the term of this patent is extended or adjusted under 35 U.S.C. 154(b) by 0 days.

(21) Appl. No.: 14/429,631

(22) PCT Filed: Sep. 20, 2013

(86) PCT No.: PCT/US2013/060862
§ 371 (c)(1),
(2) Date: Mar. 19, 2015

(87) PCT Pub. No.: WO2014/047415
PCT Pub. Date: Mar. 27, 2014

(65) Prior Publication Data
US 2015/0235840 A1   Aug. 20, 2015

Related U.S. Application Data

(60) Provisional application No. 61/703,360, filed on Sep. 20, 2012.

(51) Int. Cl.
*G21K 5/04* (2006.01)
*H01L 21/027* (2006.01)
*G03F 7/20* (2006.01)

(52) U.S. Cl.
CPC .......... *H01L 21/0274* (2013.01); *G03F 7/2045* (2013.01)

(58) Field of Classification Search
USPC .......... 250/396 R, 397, 492.1, 492.2, 492.21, 250/492.22, 492.23, 492.3
See application file for complete search history.

(56) References Cited

U.S. PATENT DOCUMENTS

| | | | |
|---|---|---|---|
| 2004/0121551 A1* | 6/2004 | Wang | 438/302 |
| 2008/0284999 A1 | 11/2008 | Thallner | |
| 2009/0168035 A1 | 7/2009 | Kim et al. | |
| 2012/0264066 A1* | 10/2012 | Chen et al. | 430/322 |
| 2013/0187046 A1* | 7/2013 | Zeidler | B82Y 10/00 250/310 |

FOREIGN PATENT DOCUMENTS

| | | |
|---|---|---|
| JP | 2009150919 A | 7/2009 |
| JP | 201040343 A | 2/2010 |

OTHER PUBLICATIONS

Patent Abstract for JP2009150919 (2009).
International Search Report for PCT/US2013/060862 dated Jan. 17, 2014.

* cited by examiner

*Primary Examiner* — Nicole Ippolito
(74) *Attorney, Agent, or Firm* — Caesar Rivise, PC

(57) ABSTRACT

A method irradiates a wafer and an apparatus provides for a wafer to be irradiated. A plurality of radiation emitters emit radiation. A mask permits a portion of the electromagnetic radiation from the plurality of radiation emitters to pass and blocks a further portion of said electromagnetic radiation from passing.

21 Claims, 18 Drawing Sheets

APPARATUS AND METHOD FOR IRRADIATING

BACKGROUND OF THE INVENTION

In the manufacture of integrated circuits (ICs) it is typical that a number of ICs are formed simultaneously on a semiconductor substrate such as a silicon (or other suitable material) wafer, which is generally circular in shape. The diameters of silicon wafers have steadily increased over the years, ranging from approximately 25 mm to the present-day state-of-the-art 300 mm. It is anticipated that 450 mm wafers will come on line in the years ahead. Older sized silicon wafers, such as 100, 150, and 200 mm, remain in production for numerous legacy products. Furthermore, ICs and semiconductors based on non-silicon and/or composite materials, such as GaAs, AlGaAS, SiGe, etc., are typically fabricated on wafers in the 50 to 200 mm diameter range. The typical thickness of a wafer ranges from approximately one-half to one mm, depending, in part, upon its diameter. Generally speaking the number of ICs of a given complexity that can be formed on a single wafer increases with the square of its diameter. Further, as IC fabrication process technology advances, the physical size of the individual transistors, conductors, and other features that comprise an IC shrink, enabling still further increases in the number of ICs that may be fabricated on a single wafer. As the number of ICs that can be produced on a wafer increases, the cost per IC correspondingly decreases. Consequently, larger diameter wafers provide opportunities for economic benefit.

In an IC fabrication process a wafer may typically go through a number of processing steps on a number of different machines. Wafers are typically moved from one machine to the next by automated equipment. Automation devices also place each wafer in turn within each machine for the respective processing step to be performed on it. In order that a wafer be properly aligned with and located in a machine, it is common that a physical indexing feature is included in each wafer. This feature may be formed as the crystal from which the wafer is cut is formed and may be indicative of its crystalline orientation. As illustrated in FIG. 1A it is usual in 200 and 300 mm diameter silicon wafers that the indexing feature is a small notch 11 in the periphery of the wafer 10. In smaller-sized silicon wafers (as well as certain 200 mm wafers) the indexing feature, as illustrated in FIG. 1B, is typically a flat segment 13 formed in the perimeter of the wafer 12. It should be noted that FIGS. 1A and 1B are not drawn to scale; in particular, for purposes of illustration, the indexing features are shown to be much larger than they actually may be. For example, notch 11 in FIG. 1A may actually be less than one or two square millimeters in size.

In one or more stages of the fabrication process, a wafer may be coated with a film of photoresist. The photoresist-coated wafer may then be exposed to electromagnetic radiation of an appropriate wavelength. A mask detailing selected geometric features of the ICs being fabricated may be placed between the source of the radiation and the wafer. In this way areas of photo resist will be exposed and the remaining areas will be non-exposed according to the geometric pattern defined by the mask. Photoresist is of two general types, positive and negative. When positive photoresist is used, exposure to electromagnetic radiation of an appropriate wavelength enables the exposed resist to be washed away with an appropriate solvent while non-exposed areas remain. The areas of the wafer thus exposed may then be uniformly treated in the next step of the fabrication process. When negative photoresist is used, the non-exposed areas may be readily washed away while the exposed areas remain. Over time, positive photoresist has become the most commonly used type. Typically electromagnetic radiation with a wavelength in the neighborhood of 400 nm or ultraviolet region is typically required for its exposure; however, other types of positive resist requiring other wavelengths are known.

A common method of applying photoresist to a wafer is spin coating. In this method the wafer is held on a chuck, often by vacuum means, so that its surface to be coated is exposed, horizontal, and facing upwards. The chuck is rotated about a central vertical axis causing the wafer to spin. An appropriate amount of liquid photoresist is deposited at or near the center of the spinning wafer. Centrifugal force then causes the resist to be uniformly distributed over the surface of the wafer. However, a bead of photoresist will usually form at the edge of the wafer. This is illustrated in FIGS. 2A and 2B. FIG. 2C is provided to illustrate the same wafer after the edge bead has been removed. It is to be emphasized that FIGS. 2A-2C are for illustrative purposes and not drawn to scale. FIG. 2A is a perspective view of a wafer 20 that has a coating 21 of photoresist; and FIG. 2B is a cross section of the wafer taken on a diameter of the wafer. Edge bead 22 of resist is seen at the edge of the wafer 20. As shown edge bead 22 rises higher than coating 21 on the surface of wafer 20, and it may extend over the edge, downwards on the cylindrical outer periphery 23 of wafer 20. Typically, photoresist coating 21 may be approximately 25 microns thick across the surface of wafer 20, except at the edge where the edge bead 22 has formed. Edge bead 22 may have a peak height above the wafer of 50 to 75 microns (that is, 25 to 50 microns above the surface of coating 21), and it may extend a distance of typically one to as much as two mm inwards from the edge 23. As shown in FIG. 2B, "D" defines the diameter of wafer 20, and "W" defines the maximum width on the wafer surface that edge bead 22 could occupy. (The fact that the ratio of W to D is typically less that 0.01 indicates how significantly out of scale the Figures are.)

For a number of well-known reasons, it is generally desirable to remove edge bead 22 before proceeding to the next step in the manufacturing process, and a number of methods exist in the prior art for doing so. It is often preferred to entirely remove the photoresist at the wafer's edge, thus exposing the wafer's surface 24a as illustrated in FIG. 2C, which is a cross sectional illustration of the wafer 20 of FIGS. 2A and 2B after edge bead 22 has been removed. Note that the removal of resist has occurred for a distance W inwards from the edge of wafer 20 as well as along the outer periphery 23 of wafer 20. A number of techniques are known for edge-bead removal. For example, mechanical methods, such as grinding, are known. Such methods may also be used at other steps of the fabrication process; for example, for removing metallic edge beads created when metallization process steps are performed. Solvent-based edge-bead removal methods, applicable to either positive or negative photoresist, are also known, such as described, for example, in U.S. Pat. No. 6,565,920. In such methods, it is typical to rotate the wafer so that a nozzle-directed stream of an appropriate solvent is uniformly applied to its circumferential edge, thus washing the edge bead away and exposing the bare, underlying surface of the wafer.

For the removal of positive photoresist edge beads, techniques involving the exposure of the edge bead to electromagnetic radiation of an appropriate wavelength to activate the photoresist followed by washing away the residue. In such techniques, care must be taken to sufficiently irradiate the photoresist in the region of the edge bead while not affecting the photoresist that covers the rest of the wafer.

One prior art approach is to use a large mercury-vapor lamp as a source of electromagnetic radiation of the required wavelength. Mercury vapor lamps having strong energy emission characteristics in the neighborhood of 400 nm are compatible with typical positive photoresists and have thus been used for this purpose.

Reflective housings, shadow masks, etc. may be used to apply the lamp's radiation to the edge region of a wafer without affecting the photoresist-coated interior region. However, a significant portion of the lamp's energy may be either absorbed or reflected by interior of the housing, an opaque shadow mask or otherwise wasted in the process, resulting in unfavorable efficiency. The wafer is held in a stationary position as the radiation is applied uniformly to its entire edge. The large mercury-vapor lamp is positioned so that the light that is emitted from the mercury-vapor lamp is emitted from a position that is centered relative to the shadow mask. The goal of this positioning is so that the light that illuminates the wafer is uniform on the wafer. In other words, it is desired that all portions of the wafer illuminated by the lamp are illuminated uniformly. By centering the emission of light relative to the mask (situated between the light emission and the wafer), the portion of the wafer that is illuminated is illuminated uniformly. Power requirements for these types of systems may disadvantageously range from several hundred watts to as much as 3000 to 5000 watts, depending in part upon the diameter of the wafer and the type of resist. In a production setting the mercury vapor lamps typical have relatively short useful lifetimes and can be costly to replace. Typically, the time required to thoroughly activate the photoresist with this technique is approximately two to three minutes.

A second prior art approach to the removal of a positive photoresist edge bead involves focusing a small, focused beam of radiation of the appropriate wavelength onto the edge of the wafer. The wafer is held on a turntable and slowly rotated so the entire edge passes the beam of radiation. With this approach the power requirements for the radiation source are much smaller and less power is wasted. However, the process may take several times longer.

SUMMARY OF INVENTION

A method irradiates a wafer and an apparatus provides for a wafer to be irradiated. A plurality of radiation emitters emit radiation. A mask permits a portion of the electromagnetic radiation from the plurality of radiation emitters to pass and blocks a further portion of said electromagnetic radiation from passing.

BRIEF DESCRIPTION OF THE DRAWINGS

It is to be emphasized that the drawings are illustrative purposes only and are thus intentionally not to scale.

DETAILED DESCRIPTION

Figure 1A:
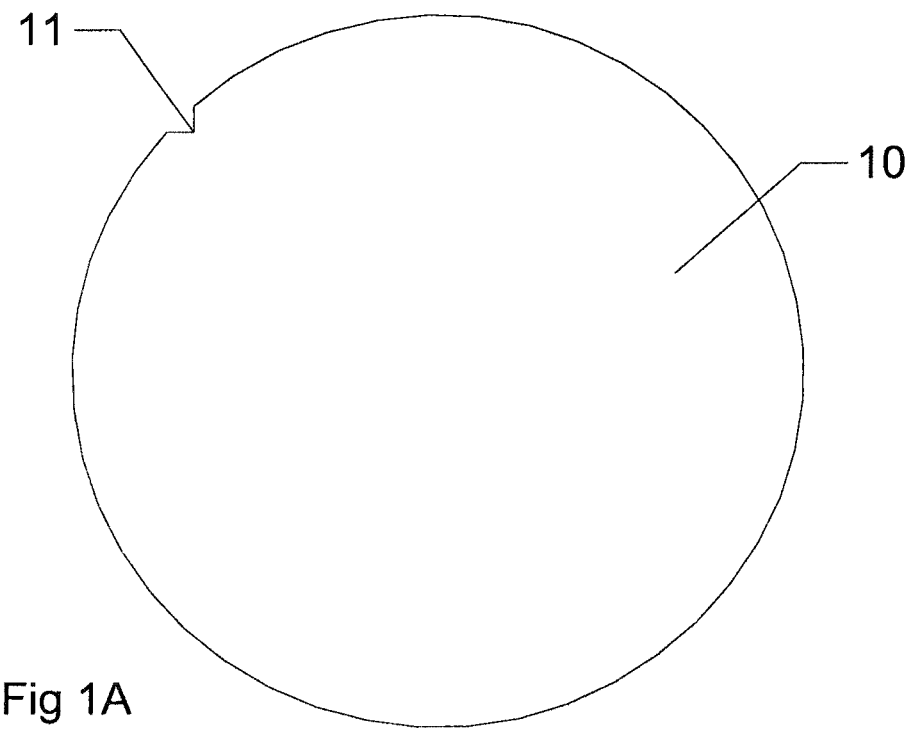
FIG. 1A is a plan view of a wafer having a small notch in its perimeter edge.

It should be observed that the two previously described prior-art techniques do not remove the edge bead. Rather they expose the edge bead to electromagnetic radiation of appropriate wavelength so that it may be washed or developed away in a subsequent operation. The present invention provides an improved method and apparatus for exposing positive photoresist edge bead to such radiation that is both fast and energy efficient.

A method and apparatus facilitate the exposure of a positive-photoresist edge bead on a wafer to electromagnetic radiation of a desired wavelength, typically, although not necessarily in the ultraviolet range. Although the invention is illustrated and described herein with reference to specific embodiments, the invention is not intended to be limited to the details shown. Rather, various modifications may be made in the details within the scope and range of equivalents of the claims and without departing from the invention. The invention will be illustrated with reference to the figures, which are not necessarily drawn to scale. Such figures are intended to be illustrative rather than limiting and are included herewith to facilitate explanation of the present invention.

A method and apparatus are provided which may be used, for example, for positive photoresist edge bead removal. In this method a continuous band of electromagnetic radiation is emitted along a path in the same shape and substantially the same size as the peripheral edge of the wafer. The radiation is applied to the edge region of the wafer. A mask is employed to prevent radiation from affecting the interior region of the wafer. The radiation is applied at an appropriate wavelength (or range of wavelengths), for a sufficient length of time, and at a sufficient power level to enable the exposed photoresist to be washed away in a subsequent operation.

The continuous band of radiation may be provided by light emitting diodes included in LED units that are spaced along said path. The light emitting diodes may be designed to emit electromagnetic radiation at (or substantially near to) said appropriate wavelength (or range of wavelengths). Each LED unit may be equipped with a lens so that its output is substantially bounded by the surface of a cone (where cone is understood in the general mathematical sense as the locus, set or union of all straight lines, sometimes referred to as the generix, passing through a single point, known as the apex or vertex, and a closed curve, known as the directrix or base). The LED units are spaced apart such that the cone-bounded volumes of radiation emitted by adjacent LED units overlap sufficiently at the surface of the wafer to provide substantially uniform power density of radiation everywhere along the wafer's edge.

Exemplary embodiments of the present invention may be readily adapted to automated, high-volume production systems or to simpler, lower-cost systems suited for laboratory uses. To provide some context to the description, a basic, exemplary generic system (FIGS. 3A and 3B) is described.

Figure 3A:
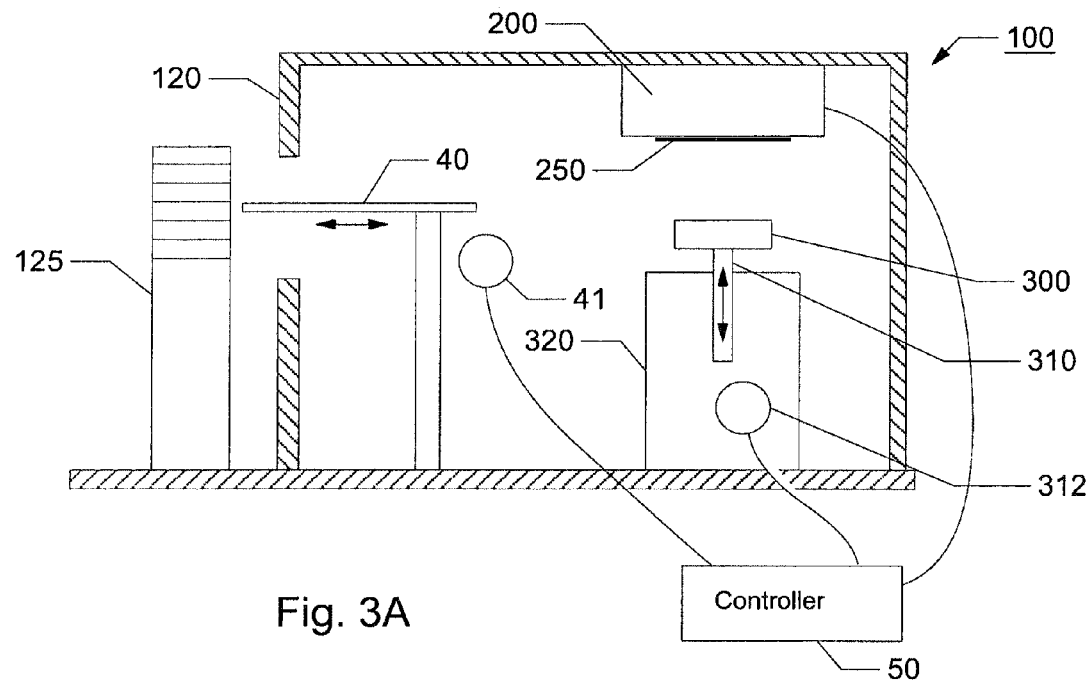
FIGS. 3A and 3B are cross section schematic views of an exemplary automated system that utilizes a wafer holding chuck and which may incorporate the present invention.
Figure 3B:
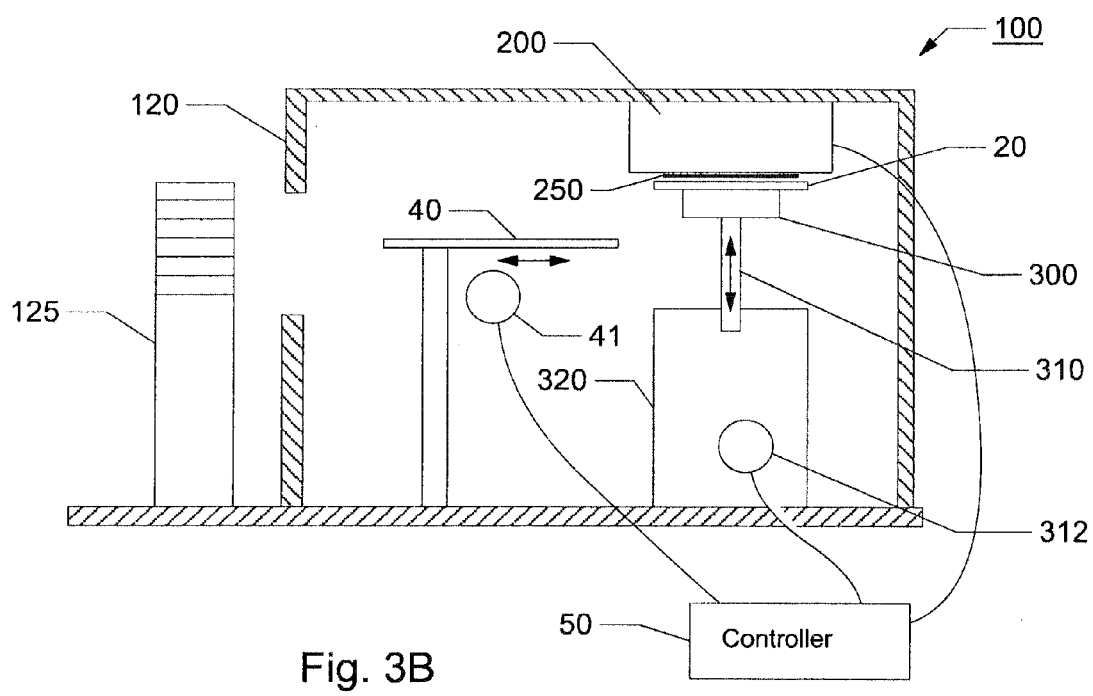

FIGS. 3A and 3B (which are not drawn to any scale) provide schematic representations of a system 100 which may include an exemplary embodiment of the present invention. The apparatus may be enclosed; a representative enclosure 120 is illustrated in cross section. A supply of wafers to be processed is available in rack 125 positioned outside of enclosure 120. A wafer-loading mechanism 40 is provided to pick a wafer 20 from rack 125 and place it accurately onto chuck 300 where it may be held in place with, for example, vacuum. Wafer-loading mechanism 40 may be a robotic device operated by actuators 41, which may in turn be controlled by a controller 50. Such automated mechanisms are commonly used in the manufacture of ICs. Chuck 300 is supported by vertical member 310, which is coupled to vertical-drive unit 320. Vertical-drive unit 320 includes actuator 312, which may also be controlled by controller 50 to cause vertical member 310, and thus chuck 300, to be moved vertically upwards and/or downwards. Directly above chuck 300 is radiation unit 200, which upon command produces electromagnetic radiation having a spectrum that includes wavelengths appropriate to activate the photoresist. In an exemplary system such wavelengths may desirably be in the 390 to 410 nm range. Shadow mask 250 is changeably coupled to radiation unit 200 to prevent radiation from being directed to areas where it is not wanted. Shadow mask 250 may be readily changed by conventional means to adapt the system to different situations. Controller 50 may also control radiation unit 200. In an exemplary system the controller may turn the radiation source on or off. In another exemplary system the controller may also control the intensity of the radiation while the source is on.

The radiation emitted by radiation unit 200 is emitted in a manner so that a portion of the radiation emitted by radiation unit 200 is blocked by shadow mask 250 from illuminating the wafer on chuck 300 (or other supporting structure). Another portion of the radiation emitted by radiation unit 200 passes shadow mask 250 and illuminates the wafer on chuck 300. Radiation unit 200 is positioned in a manner so that the emitted radiation is partially blocked by shadow mask 250 and partially passes shadow mask 250. In the prior art, the illumination that is blocked by the shadow mask and that passes the shadow mask is emitted from a location that coincides with a center of the mask. In the prior art, by centering the location of radiation emission relative to the mask, the radiation that reaches the wafer reaches the wafer uniformly in all areas of the wafer that are reached. By using the word "center" what is intended is a location which corresponds to a physical center of the mask. Put another way, if the mask is a planar object, and a line which is orthogonal to the plane of the mask intersects the mask at midpoint between two edges of the mask, the "center" would be along that line. In the prior art, radiation was emitted from along that line to ensure that the radiation is uniformly applied to the wafer (i.e. the portions of the wafer that are not covered by the mask). In an exemplary embodiment of the present invention, however, the radiation is not emitted from a location which corresponds to a center of the mask. Rather, the radiation is emitted from a location which is away from the center of the mask. Put another way, a non-linear line can be envisioned which is located about the center of the mask. Radiation can be emitted from locations along that line.

Mask 250 includes a continuous edge.

The operation of system 100 is now briefly described. It is first assumed that no wafer is present on chuck 300, that a rack 125 containing wafers is properly positioned with respect to wafer-loading mechanism 40, and that the radiation source is off. Controller 50 first directs actuator 312 to position chuck 300 to a "wafer-receiving" position, such as that shown in FIG. 3A, where it can interact with wafer-loading mechanism 40 to receive a new wafer. Upon the arrival of chuck 300 at that position, controller 50 next directs wafer-loading mechanism 40 to acquire the next wafer 20 to be operated on from rack 125 and to place it accurately in position on chuck 300. Once so placed, controller 40 provides a signal to turn on a clamping mechanism, (not shown) to secure wafer 20 in position. In an exemplary embodiment the clamping mechanism is a vacuum. Controller 50 then directs actuator 312 to raise chuck 300 to a position such as is shown in FIG. 3B so that wafer 20 is in close alignment with and proximity to radiation unit 200 and shadow mask 250. Radiation unit 200 may then be turned on, directing its energy in the direction of wafer 20. Shadow mask 250 ensures that no radiation reaches the central portion of wafer 20 and that radiation is only applied to the edge-bead region at the periphery of wafer 20. When sufficient radiation has been applied, source 200 may be turned off and chuck 300 and wafer 20 may be lowered to a position where the clamping mechanism can be released and mechanism 40 can remove wafer 20 from chuck 300. Mechanism 40 may then return wafer 20 to rack 125 or to a desired alternate location.

Figure 4A:
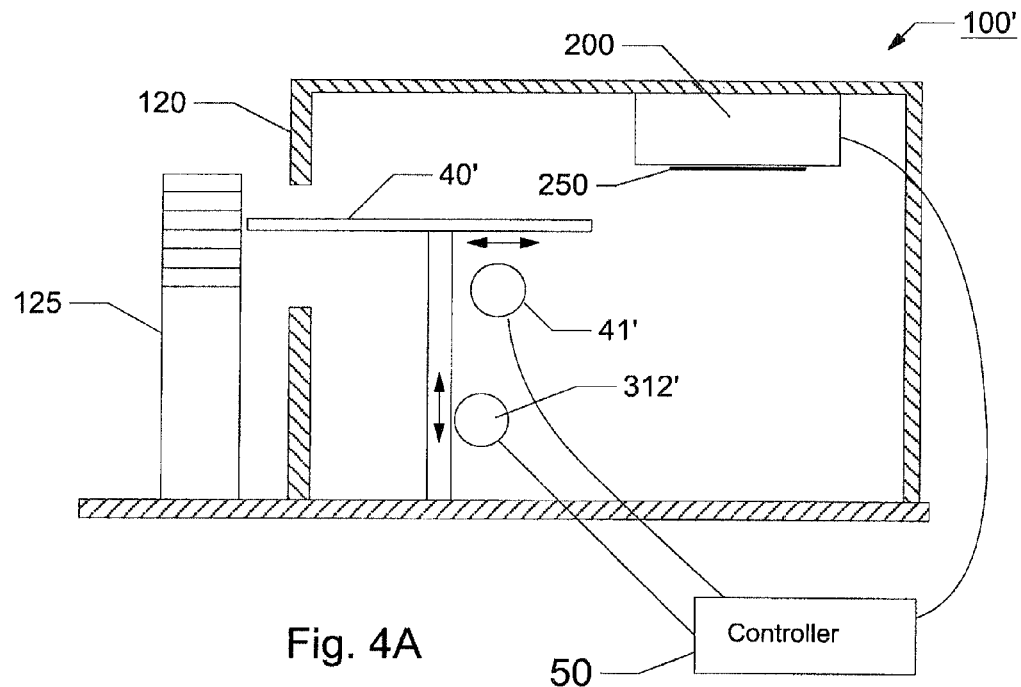
FIGS. 4A and 4B are cross section schematic views of yet another exemplary automated system that utilizes a wafer holding chuck and which may incorporate the present invention.
Figure 4B:
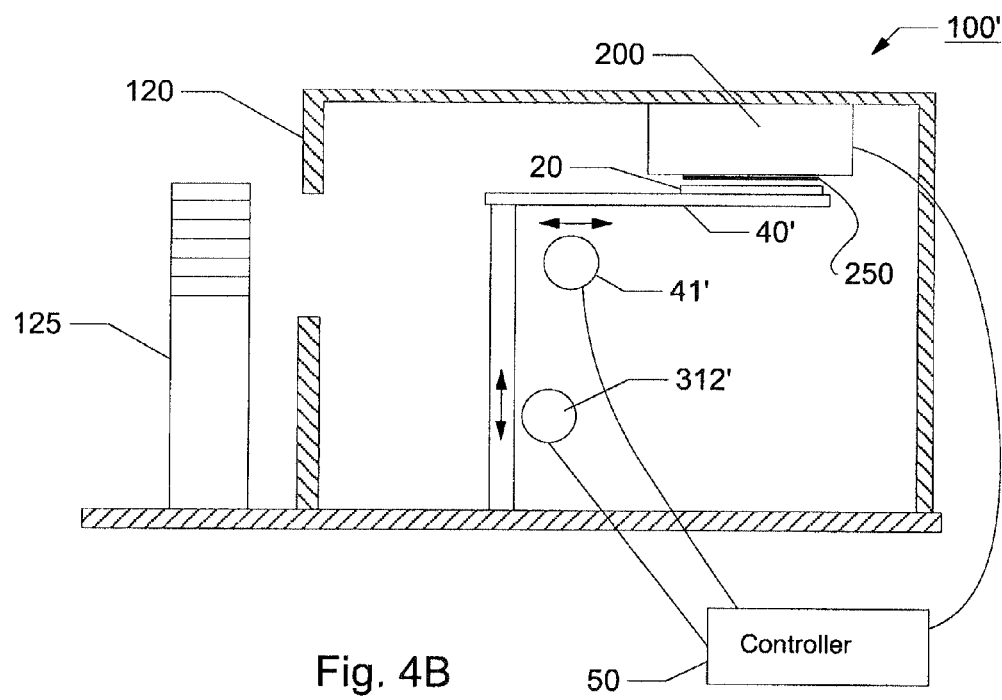

FIGS. 4A and 4B (which also are not drawn to any scale) schematically illustrate an alternative exemplary embodiment. This embodiment, shown with respect to system 100' does not incorporate a movable, wafer-holding chuck. Instead, robotic arm 40', controlled by actuators 312' and 41' (and others as need be), is equipped with expanded capabilities to enable it accurately pick up, place and hold wafer 20 in position for exposure of its edge to radiation. To briefly describe operation of system 100' it is first assumed that no wafer is present on arm 40', that a rack 125 containing wafers is properly positioned with respect to arm 40', and that the radiation source is off. Controller 50 first directs arm 40' to a "wafer-receiving" position, such as that shown in FIG. 4A, where it can receive a new wafer. Upon the arrival of arm 40' at that position, controller 50 next directs it to acquire the next wafer 20 to be operated on from rack 125. Controller 50 then directs actuators 312' and 41' (and others as need be) maneuver arm 40' to a position such as is shown in FIG. 4B so that wafer 20 is in close proximity to radiation unit 200 and shadow mask 250. As in the previously described system, radiation unit 200 may then be turned on, directing its energy in the direction of wafer 20. Shadow mask 250 ensures that no radiation reaches the central portion of wafer 20 and that radiation is only applied to the edge-bead region at the periphery of wafer 20. When sufficient radiation has been applied, source 200 may be turned off and arm 40' and wafer 20 may be maneuvered to a position where wafer 20 may be returned to rack 125 or to a desired alternate location.

The foregoing describes two exemplary systems, either of which may utilize either certain prior-art edge-bead removal technologies or the present invention. Those having reasonable knowledge and skill in the art will appreciate that the afore-described systems for placing a wafer precisely in position for being treated is generic and that many alternative variations are possible. Possible variations include, but are not necessarily limited to: alternative numbers and locations of wafer storage racks, presence or absence of an enclosure, manual or hand placement of wafers and operation of the radiation source in a laboratory environment, utilization of a robotic arm rather than a chuck to position the wafer with respect to the radiation source, and countless others.

Figure 2A:
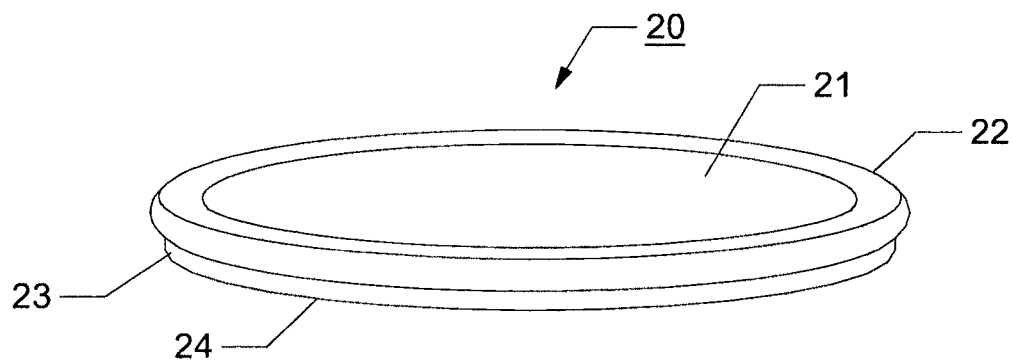
FIG. 2A is a perspective view of a wafer which has been coated with photoresist and having an edge bead of photoresist.
Figure 2B:
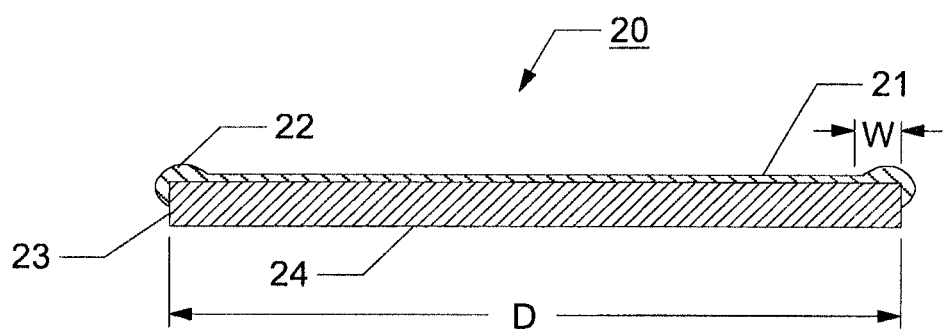
FIG. 2B is a cross sectional view along a diameter of the wafer of FIG. 2A.
Figure 2C:
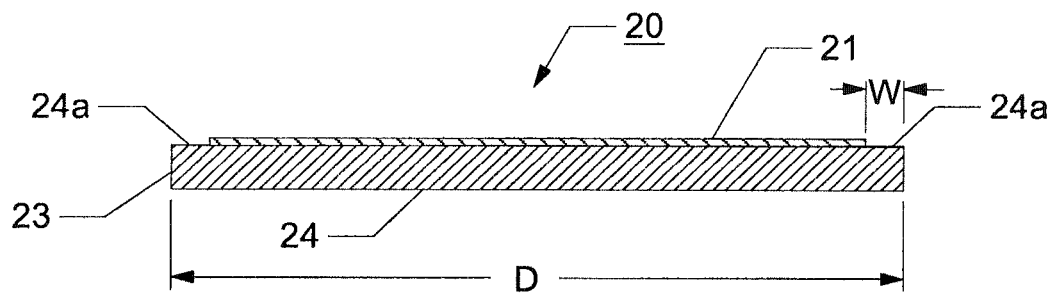
FIG. 2C is a cross sectional view of the wafer of FIG. 2A with the edge bead removed.
Figure 5A:
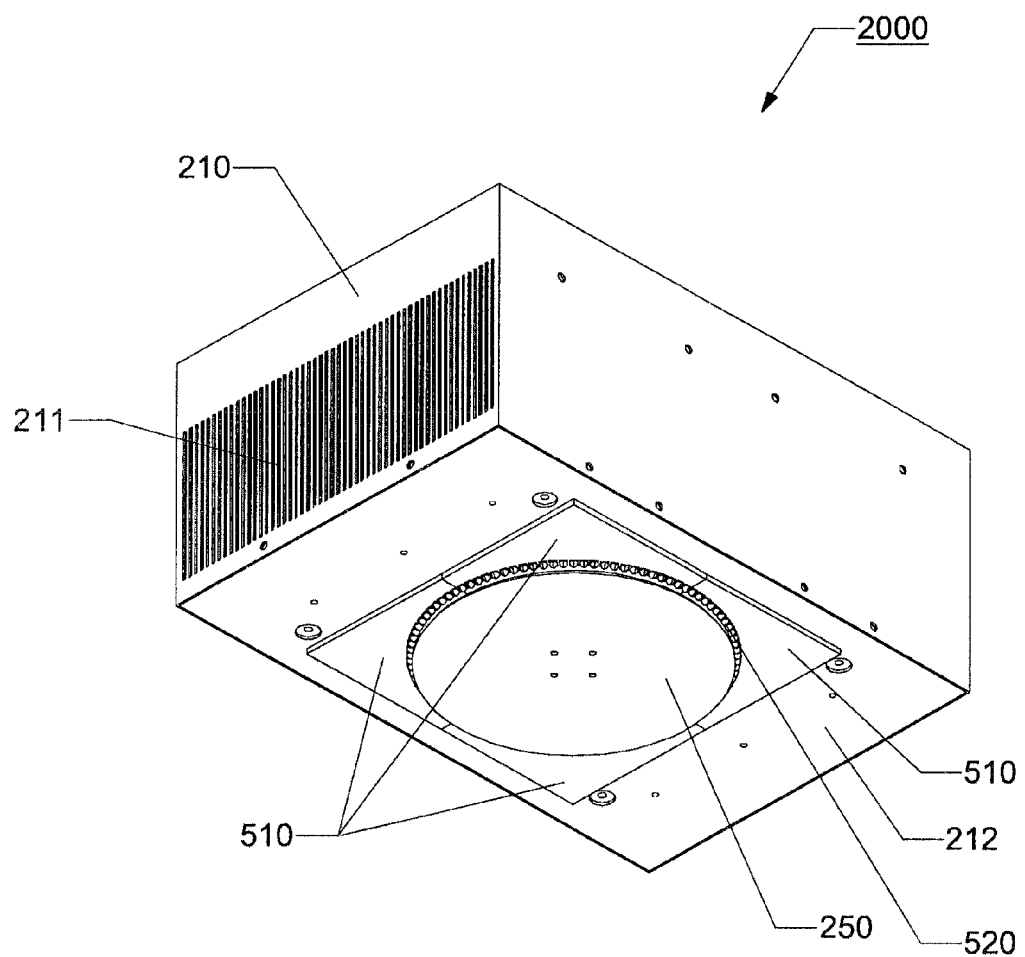
FIG. 5A is a perspective view of an exemplary radiation unit which incorporates the invention.
Figure 5B:
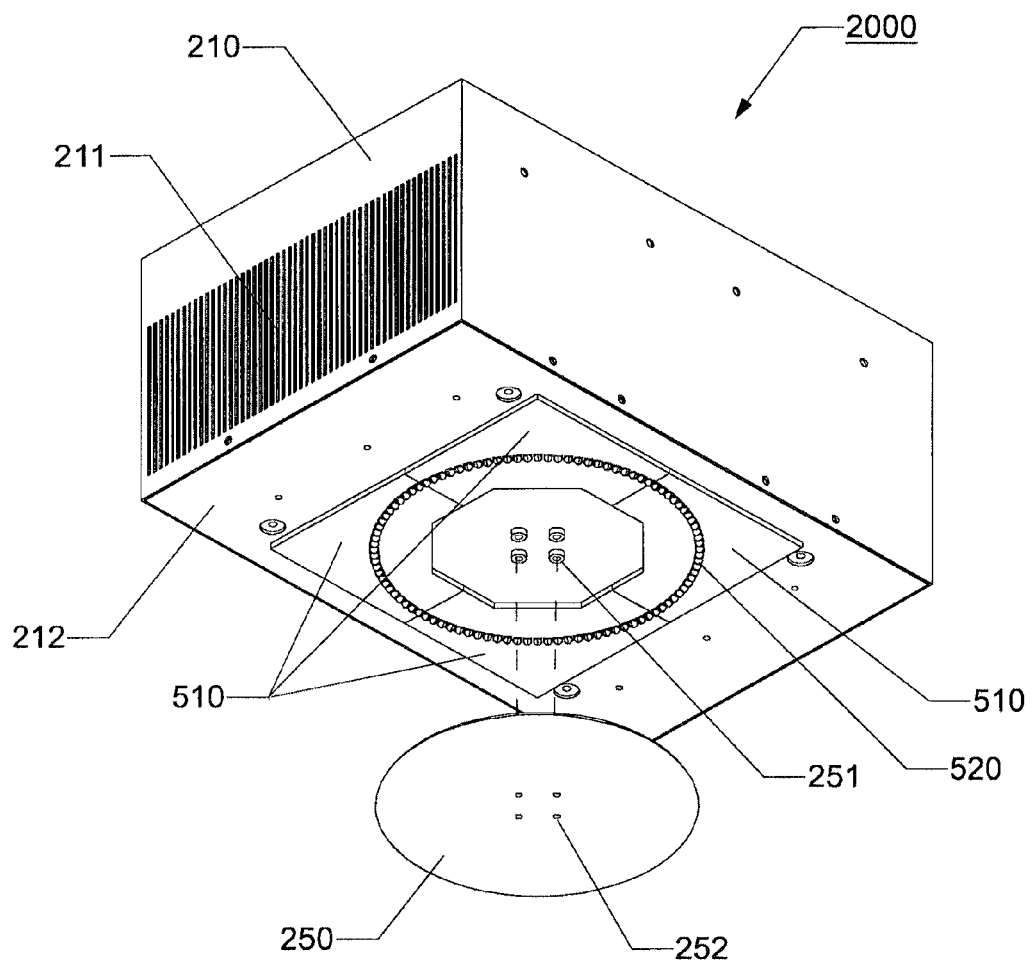
FIG. 5B is a partially exploded view of FIG. 5A.
Figure 6A:
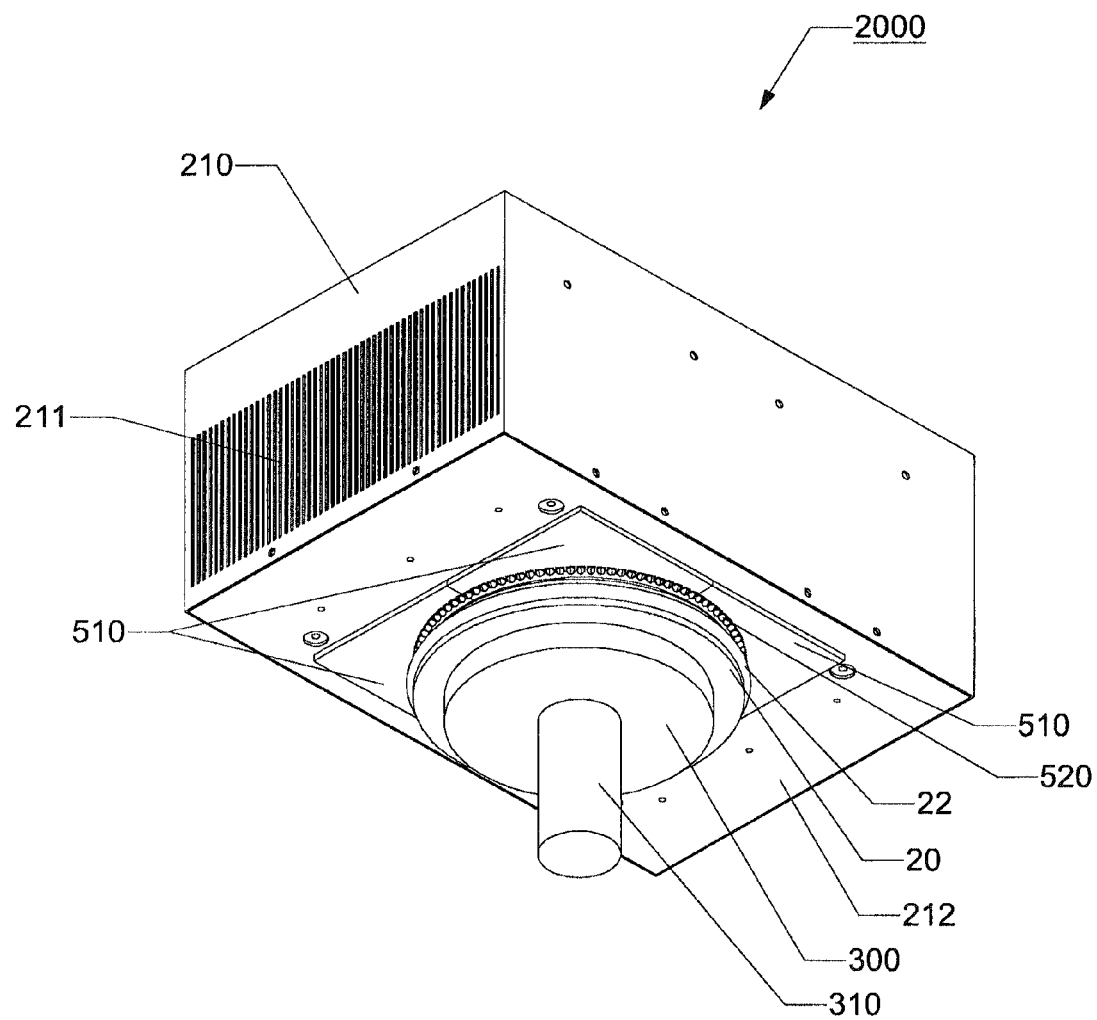
FIG. 6A is a perspective view of the exemplary radiation unit of FIG. 5A together with a wafer held in position for exposure of its edge to radiation.
Figure 6B:
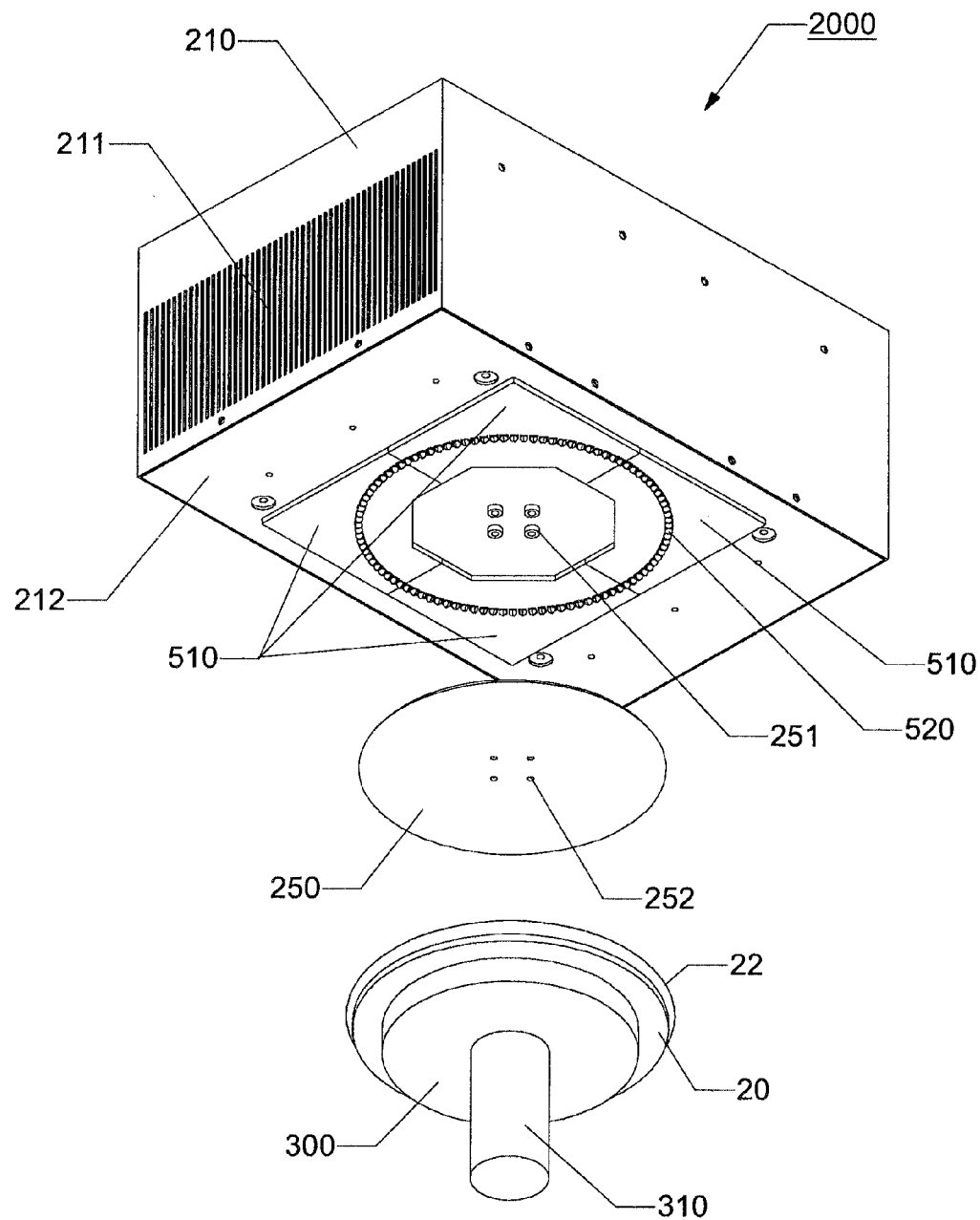
FIG. 6B is a partially exploded view of FIG. 6A.

A perspective view of an exemplary radiation unit 2000 which includes an exemplary embodiment of the present invention is shown in FIG. 5A, and a partially exploded perspective view is provided in FIG. 5B. FIGS. 6A and 6B provide a perspective view and a partially exploded perspective view respectively of chuck 300 and vertical member 310 holding wafer 20 having a photoresist edge bead 22 in proximate position to radiation unit 200 for being treated with radiation. (For illustrative purposes, wafer 20 is the same as illustrative wafer 20 in FIGS. 2A-2C previously discussed.) These views are not necessarily drawn to scale, and as previously indicated chuck 300 and vertical member 310 may be replaced by other holding/positioning means. Radiation unit 2000 includes enclosure 210, which may enclose electronics and other power dissipating devices (not shown). In order to provide cooling, fans (not shown) may be included as well as ventilation openings. 211. Furthermore, the bottom surface 212 may serve as a heat sink and be fabricated from an appropriate, heat-conducting material, such as aluminum. The remaining five sides of enclosure 210 may be conveniently fabricated from sheet metal. For convenience, bottom surface 212 may hereinafter be referred to as "heat sink" 212.

Figure 7:
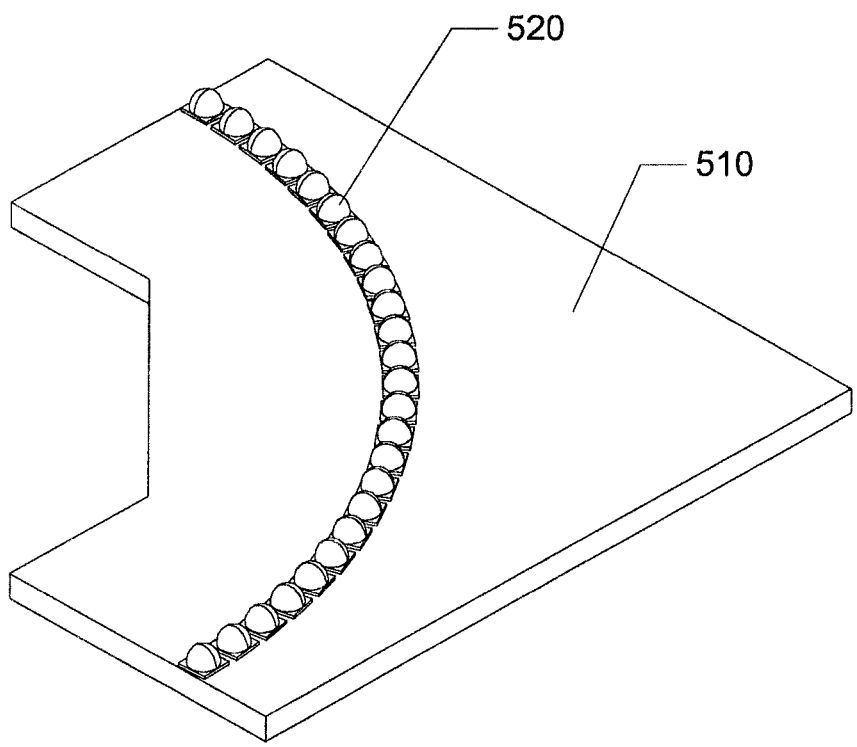
FIG. 7 is a perspective view of a printed circuit board upon which are disposed a number of LED units, serving as radiation sources, along a path corresponding to the edge bead of a wafer.
Figure 8:
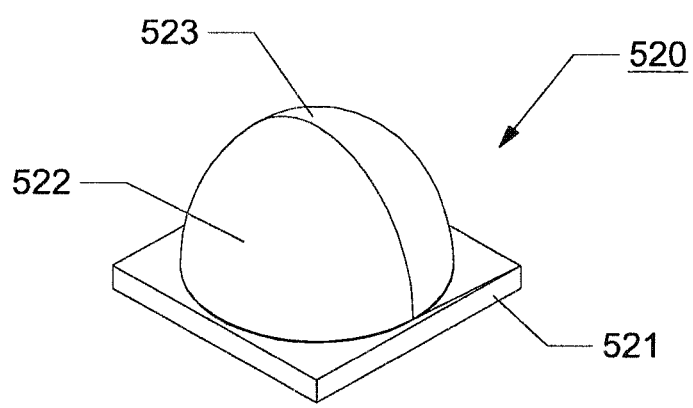
FIG. 8 is a perspective view of an individual LED unit.

Mounted on the outer or lower surface of heat sink 212 are four printed circuit boards 510, which, in this case, are all identical. FIG. 7 provides a perspective view of one of the four circuit boards 510. Attached to each circuit board 510 are a number of individual radiation sources 520; an enlarged perspective view of an individual radiation source 520 is provided in FIG. 8. In overview, radiation sources 520 are of a type that provides radiation at the desired wavelength, and they are arranged in a manner to provide a continuous stripe of radiation along the path to be treated. Thus, the radiation sources 520 are configured so that radiation from at least two of the radiation sources 520 overlaps at a location beyond mask 250. Furthermore, the radiation from the radiation sources overlaps when they radiate the wafer. Thus, each circuit board 510 provides one quadrant of a circle of radiation sources 520. Also mask 250 may be provided to prevent radiation from affecting areas of the wafer or its surrounds where it is not desired. Further details and information are next provided.

Each radiation source 520 is an assembly that includes a substrate or base 521 and a lens 522, having a top 523 at the furthest point from base 521. Mounted on substrate/base 521 and enclosed by lens 522 are one or more radiation emitters for emitting electromagnetic radiation. In an exemplary embodiment of the present invention, the radiation emitters are semiconductor light emitting diodes (which are not visible in the drawings in that they are hidden by lens 522). Accordingly, such radiation source assemblies may be referred to as a "LED units." Presently, LED units are available with one to four light emitting diodes mounted either on individual die or all on one die. It is contemplated that LED units containing more light emitting diodes may be available at a future time and would be usable within the spirit of the present invention. As previously noted, these are disposed along a circular path having the approximate diameter of the wafers 20 to be treated. LED units 520 are designed to emit radiation having the desired wavelength (or wavelengths) and intensity for treating the photoresist edge bead 22 that may exist on the wafer 20 as previously illustrated in FIGS. 2A-2B. In particular the light emitting diodes include P-N junctions fabricated of appropriate semiconductor materials that are appropriately doped to provide an energy band gap that corresponds to the desired wavelength. (Although the emitted wavelength may not necessarily be in the visible spectrum, the term "light emitting diode is generally used to refer to all such radiation emitting diodes.) In an exemplary embodiment the desired radiation has a wavelength of approximately 400 nm. Radiation sources 520 may be mounted on one or more printed circuit boards 510, which are in turn attached to the outer or lower surface of heat sink 212. For convenience, four identical printed circuit boards 510 are utilized in the exemplary system 200 of FIGS. 5A-6B. (In other embodiments more or fewer printed circuit boards may be used as may be most convenient.) Using conventional, well-known techniques, printed circuit boards 510 provide electrical connections between control circuitry contained in enclosure 210 and the respective light emitting diodes (not visible) included in LED units 520 by way of electrical contacts included in respective substrates 510. When the light emitting diodes are forward biased and electrical current passes through them, radiation is emitted having a wavelength (or range of wavelengths) determined by the design of the semiconductor devices. It is noted that the wavelength (or wavelengths), being a function of the physically fixed band gap, will advantageously be essentially constant over a relatively wide range of currents; and, furthermore, the intensity of the emitted radiation increases (decreases) monotonically with increasing (decreasing) current respectively.

The electromagnetic radiation produced by the radiation emitters may be emitted from locations which may be away from a center of mask 250. By using the word "emit" what is intended is the place where the electromagnetic radiation is present before it reaches mask 250 and the wafer. Thus, for example, the electromagnetic radiation (whether it is visible light, UV, x-ray or any other form of electromagnetic radiation) can be generated at any location, and the electromagnetic radiation can be channeled to a variety of locations before being emitted and reaching mask 250 (i.e. some of the radiation is blocked by mask 250 and some of the radiation radiates the wafer). The electromagnetic radiation can be directed prior to being emitted towards mask 250 using various techniques, including (for example) but not limited to lenses, mirror, light pipes, etc. As mask 250 includes a continuous edge, the radiation is emitted from a plurality of locations above the edge.

It is well known that the forward-biased voltage drop across a diode is highly non-linear and often approximately modeled as a constant voltage in series with a small resistance, both parameters being dependent upon the semiconductor materials incorporated. Due to variations, however slight, in the fabrication process, the values of these parameters may vary slightly from one diode to the next. Accordingly, it is preferable to not connect two or more diodes in parallel, as the diode with the lowest values of these parameters may keep the others from conducting fully. Thus, groups of LED units may preferably be electrically connected in series so that a single electrical source can provide current equally to all in the group. Similarly, LED units that include multiple light emitting diodes may be wired so that the individual diodes are connected in series. Failures of LED units within a group may be detected in real time by monitoring (with a threshold comparator, for example) the voltage drop across the group. Additionally, the LED units of different groups may be disposed so that that they are interleaved. In this way a failed-open diode would not cause a continuous segment of the line of LED units to go dark or off, allowing the system to remain at least somewhat useable.

The intensity of the electromagnetic radiation emitted by LED units 520 can be varied by adjusting the amount of current flowing through LED units 520. Thus, the intensity of the electromagnetic radiation emitted by LED units can be varied depending upon, for example, the photoresist properties of the materials which have been applied to the wafer.

Figure 9:
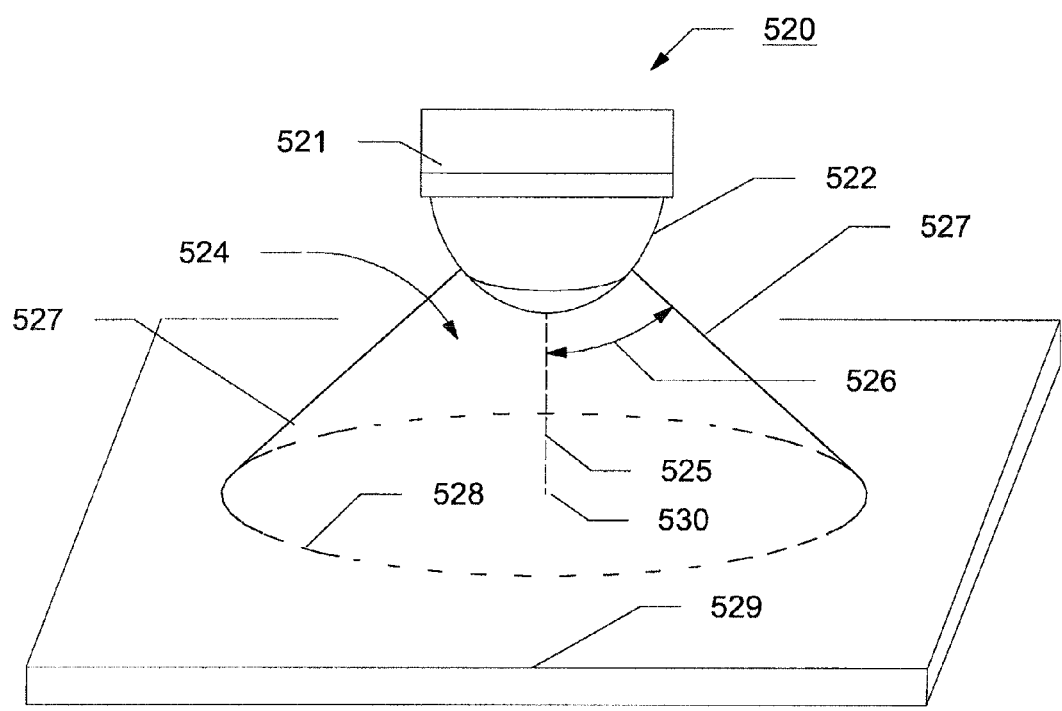
FIG. 9 is a perspective view of a LED unit illustrating a right-circular cone shaped surface that bounds 50% of its emitted energy.

Lenses 522 of LED units 520 may be of the type to cause a substantial amount of the radiation energy generated by the light emitting diodes to be projected in a spatial region that is substantially bounded by the surface of a cone. A spatial region so bounded will be hereinafter referred to as a "conical volume." It is to be noted that the term "cone" is herein defined according to its general mathematical definition; in particular, "cone" is understood to mean the locus, set or union of all straight lines, sometimes referred to as the generix, passing through a single point, known as the apex or vertex, and a closed curve, known as the directrix or base. Many contemporary LED units include a lens that provides a right circular conical surface; that is, a the surface of a cone having a circular directrix and an axis defined by a line passing through the apex and the center of the directrix and that is perpendicular to the plane of the circle. Such a LED unit may be mounted so that its axis is perpendicular to a printed circuit board 510. This is illustrated schematically, for example, in FIG. 9, which provides a side view of LED unit 520 and its associated conical volume 524. Conical volume 524 represents a region where 50% or more of the radiation energy emitted by LED unit 520 is transmitted. Depending upon the design of the lens, the angle 526 between the axis 525 of the cone and side 527 of cone 524 bounding 50% of the energy may typically be in the range of 40 to 60 degrees. If the radiation is projected onto a flat surface 529 that is perpendicular to the axis of the cone, thus defining a circle 528 where the cone and surface intersect, the intensity at the surface 529 is at a maximum at the center of the circle 530, which is the intersection of the axis 525 and the surface 529. The intensity then diminishes as the distance from the center of the circle is increased. For example, the intensity may vary in a Gaussian (e.g., bell-shaped) fashion across a diameter of the circle 528 with the peak of the curve at its center 530. Additionally, the diameter of the circle 528 clearly increases with increasing distance between the LED unit 520 and the surface 529 while the quantity of radiation (e.g. number of photons) striking the surface in a given amount of time remains constant. Thus, the intensity at any point on the surface 529 is seen to vary inversely with the distance separating the surface 529 and the LED unit 520.

At present other styles of lenses are commercially available on certain LED units. For example lenses that provide an oval shaped directrix are known to be available. It is contemplated that further possibilities are or may become available in the future; for example, a LENS unit having a rectangular directrix may prove to be of particular advantage. Although the invention is described principally in terms of LED units having right-circular conical volumes, such alternatives may prove advantageous in the practice of the present invention, may be readily adapted by one of reasonable skill, and thus are considered to be included within the scope of the invention.

It may be stated at this point, that a wide range of options and configurations for wave lengths, lenses, mounting, power levels, etc. in LED units are commercially available. Further, there are commercial sources that will often provide customized LED units within a reasonable range of parameters for specific applications, such as the present invention.

Figure 10:
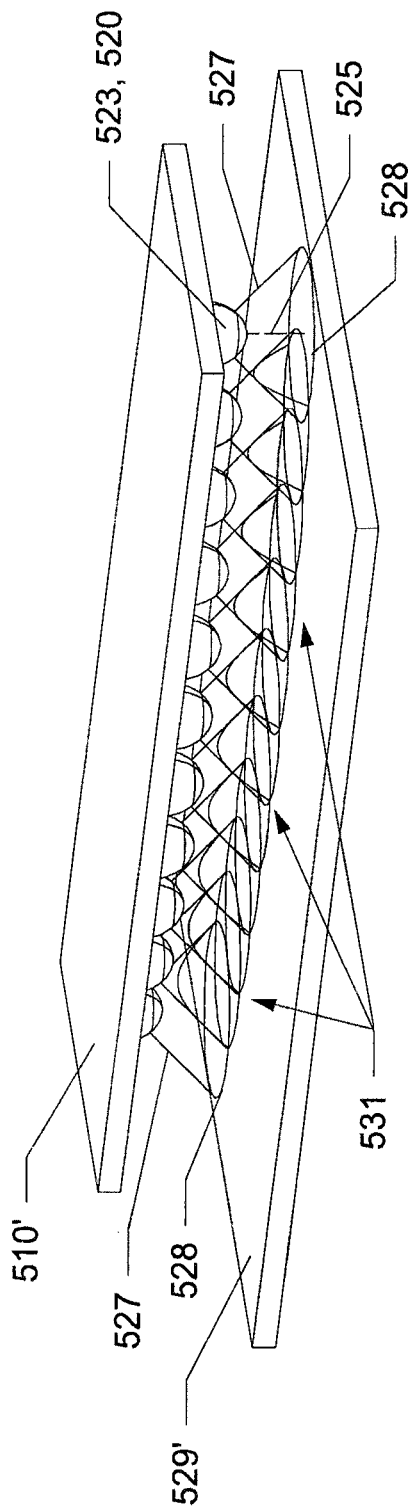
FIG. 10 is a perspective schematic view of a number of LED units disposed along a path on a printed circuit board and the resulting path of emitted radiation striking a surface.

Adjacent radiation sources may be located in close proximity to one another so that their respective cones of radiation overlap one another. This is illustrated schematically, for example, in FIG. 10 where eleven closely-adjacent LED units are shown disposed along an arc of a curve on the lower side of board 510' and whose emitted radiation (represented by right-circular cone sides 527 and bases 528) is directed generally downwards and projected onto flat surface 529'. (Board 510' represents a portion of printed circuit board 510 of FIG. 7 and surface 529' represents the plane of a wafer undergoing treatment.) Surface 529' is parallel to the plane upon which radiation sources 520 are mounted; in other words it is perpendicular to the axes 525 (only one is shown for clarity purposes) of the right-circular cones 527 of radiation projected from sources 520. As seen the radiation patterns projected by each LED unit form overlapping circles 528 on surface 529', providing a continuous path of radiation 531 thereupon. It will be appreciated that if surface 529' represents the relative location of the target surface or wafer to be treated, the radius of the circle may be considerably larger than the width of the edge bead (or other possible track or path to be treated). Thus the total number LED units will vary. The total number of LED units may be determined by the number of LED units that provide a uniform amount of electromagnetic radiation along the path that is receiving the electromagnetic radiation. A mask may be placed between the radiation sources and the target surface or wafer to prevent radiation from striking regions of the surface where it is not desired.

Figure 11:
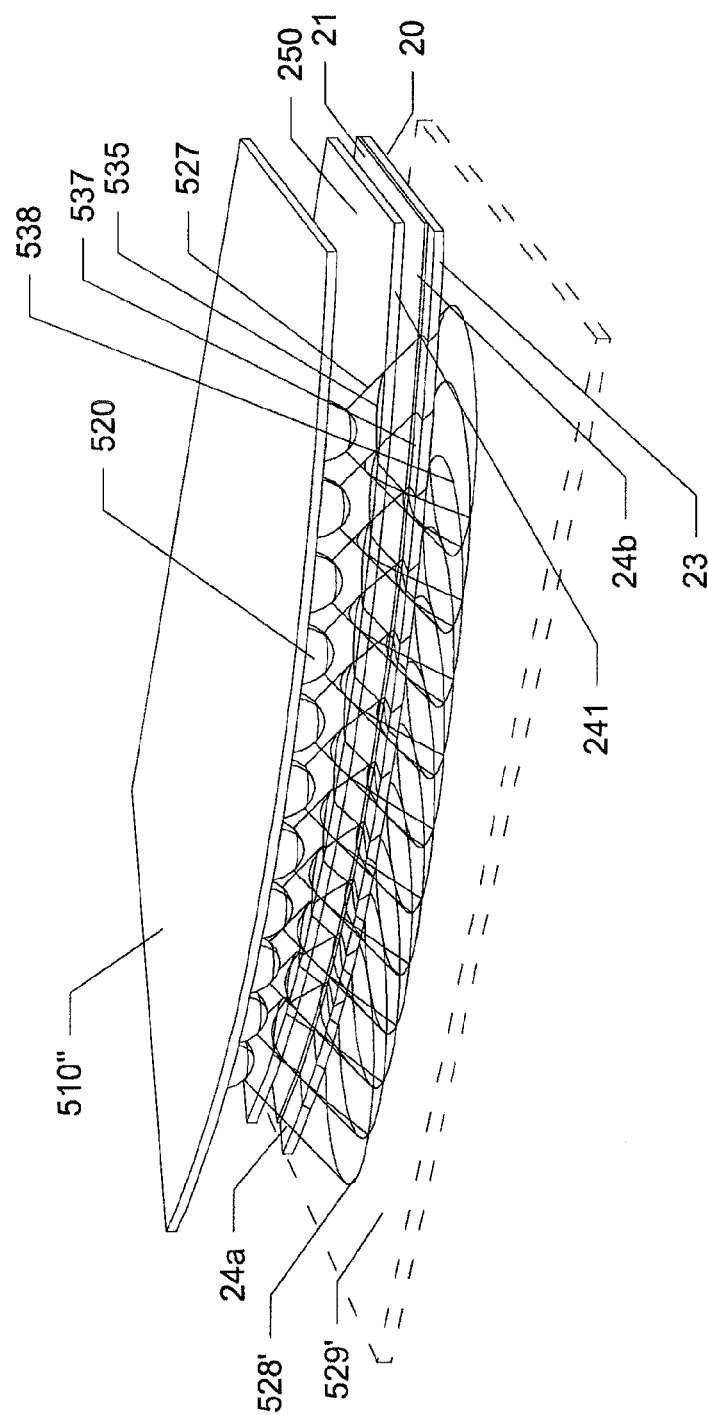
FIG. 11 is a perspective schematic view illustrating the path of radiation provided by a number of LED units disposed along a path on a printed circuit board conforming to the edge of a wafer with a mask located between the wafer and LED units preventing radiation from striking the interior of the wafer.

FIG. 11 is now discussed to extend the foregoing to precisely applying radiation to an edge bead on a wafer. This situation is schematically illustrated in FIG. 11 where mask 240 has been inserted between LED units 520 and wafer 20, which has been substituted for surface 529' of FIG. 10. Thus, FIG. 11 may be viewed as a representation of a broken out portion of system 2000 of FIGS. 5A-6B. Mask 250 is parallel to the surface 21 of wafer 20. As in the foregoing, the surface 21 of wafer 20 is parallel to the plane of printed circuit board 510' upon which radiation sources 520 are mounted. Further wafer 20 is shown as having peripheral edge 23 and region 24a adjacent to and extending along peripheral edge 24a. Region 24a corresponds to the region of wafer 20 where an edge bead may reside. (For illustrative purposes an edge bead is not shown in FIG. 11), Led units 520 are shown as arranged so that the axes 525 of the cones of radiation 527 (i.e., their optical centers) substantially coincide with peripheral edge 23; alternatively they may be arranged so as to intersect the interior of region 24a. Mask 250 is opaque to the radiation and its edge 241 is situated to coincide with the interior boundary of region 24a. It is seen that a portion 535 of the radiation strikes mask 240 and is thus not transmitted to wafer 20. Due to the location of Mask 250 no radiation reaches surface 21 of wafer 20 anyplace that is not in region 24a. The remaining portion of the radiation cone passes the mask. Of portion 536 stripe 537 strikes region 24a, and the remainder 538 passes by peripheral edge 23 of wafer 20. The remainder 538 is shown hitting phantom surface 529', which may or may not be present in any particular embodiment. Thus a stripe of radiation is delivered to region 24a of wafer 20, and radiation is prevented from reaching areas on surface 21 of wafer 20 that are away from region 24a. Due to the overlapping of the cones of radiation, the intensity of the radiation along the stripe at the edge of the wafer is essentially uniform enough to adequately treat the entire edge bead. Additional mask apparatus may be deployed, if desired, away from the peripheral edge 23 of wafer 20 to prevent or limit radiation that by passes wafer 20 from affecting other apparatuses or becoming a safety issue.

With the foregoing as background, the discussion of the exemplary embodiment 2000 of the present invention illustrated in FIGS. 5A-6B may now be continued. This particular embodiment is intended to treat wafers having a small alignment notch of the type illustrated in FIG. 1A, which is of negligible size with respect to an edge bead, and may thus be ignored for the purposes of this discussion. Printed circuit boards 510 are designed so that the optical centers (that is the axes of their respective cones of radiation) of LED units 520 are disposed on a circle having the same diameter as the wafer. The square base 521 of an exemplary LED unit 520 is approximately five mm by five mm. For a system designed to treat two hundred mm diameter wafers, one hundred such LED units may be mounted closely to one another with their optical centers on approximate 6.28 mm centers on a circle of 200 mm diameter. Thus, each printed circuit board 510 includes twenty-five LED units 520.

Mask 250 is a circular disk of a material that is opaque to the radiation produced by LED units 520. Opaqueness may be the result of an absorption characteristic or a reflective characteristic or a combination of the two. Generally, it is preferable to use a material that is primarily reflective in order to prevent heating and undue expansion of the mask while in operation. Accordingly, in an exemplary embodiment reflective aluminum is used, which may be polished as desired. As an alternative, screen printed glass may be used. The diameter of mask 250 should be slightly less than the diameter of the wafers to be processed. In particular, if it is required to irradiate an edge bead occupying a band of width W along the outer edge of a wafer of diameter D the diameter of mask 250 should be D−2W. (Note that W may also be interpreted as being the maximum width of the edge bead.) For example, if the wafers have a diameter of two hundred mm and the edge bead may occupy up to three mm of the peripheral edge of a wafer, the diameter of the mask should be 194 mm. Mask 250 should preferably be held rigidly such that it is parallel with the plane of heat sink 212 and the plane defined by the lens tops 523 of LED units 520. Further, it is preferable that that mask 250 be located close to—but not in contact with—the lenses 523 of LED units 520. Typically a spacing of approximately five to twelve mm may preferably be provided between LED units 520 and mask 250. Finally, the center of mask 250 should preferably be aligned with the center of the circle of LED units 520 so that the two circles are concentric. As indicted in FIG. 6A, in an exemplary embodiment mask 250 may be mounted against spacers which abut heat sink 212 and may be held in place by suitable screws (not shown) which pass through clearance holes 252 in mask 250, corresponding clearance holes in spacers 251 and are threaded into corresponding tapped holes in heat sink 212. Spacers 251 are of a size to position mask 250 in the desired location. Those of ordinary skill in the art may readily find a number of adequate alternative methods of attaching mask 250.

Thus, mask 250 permits a portion of emitted electromagnetic radiation from multiple electromagnetic emission locations to pass and blocks a further portion of said electromagnetic radiation from the multiple electromagnetic emission locations from passing. As explained above, the electromagnetic radiation is directed towards the mask from the locations from which it is emitted. The locations may be directly above or indirectly above an edge of mask 250. Each of the radiation emitters emit electromagnetic radiation which are blocked from passing the mask by a respectively different portion of the mask.

FIGS. 6A and 6B provide perspective and exploded perspective views of a wafer 20 having edge bead 22 held in position by chuck 300 for treatment by the exemplary radiation unit 2000 of FIGS. 5A and 5B. Preferably, wafer 20 is positioned so as to be parallel to mask 250 and so that the center of wafer 20 is aligned with the center of mask 250. In other words wafer 20 is planarized and centered with respect to mask 250. It is also preferable that the wafer 20 to be treated is brought into close proximity to mask 250. Typically, when positioned, the spacing between wafer 20 and mask 250 is approximately five to ten mm.

Once positioned as described above, the LED units 520 may be turned on, applying the desired radiation to the edge bead 22. Mask 250, as previously discussed, prevents radiation from reaching areas of the wafer 20 that are interior to edge bead 22. In other words mask 250 places the region of the wafer that is interior to the edge bead in a protective shadow. When sufficient radiation has been applied to cause the desired effect, LED units 520 may be turned off and wafer 20 may be removed from position and placed at a desired destination.

Figure 12A:
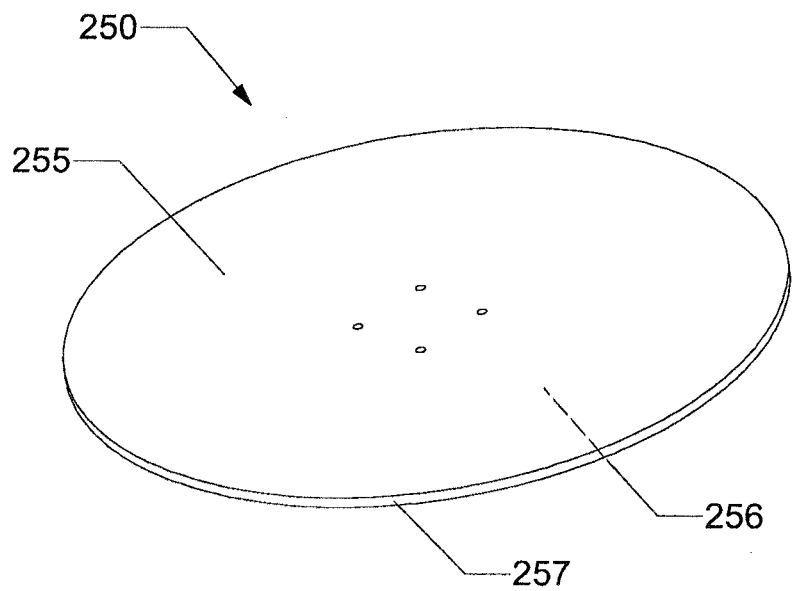
FIGS. 12A and 12B are perspective views of two alternative masks which may be incorporated with the exemplary radiation unit of FIGS. 5A through 6B.
Figure 12B:
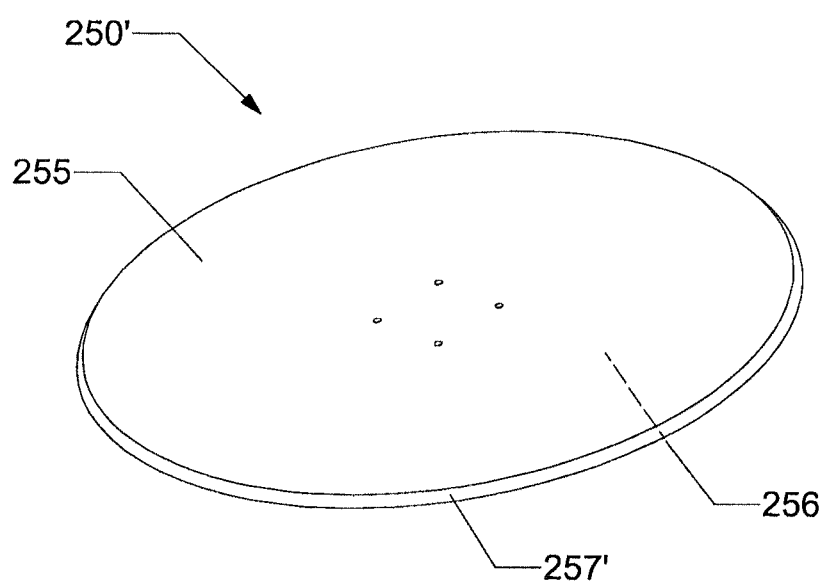

FIGS. 12A and 12B illustrate two possible embodiments of a mask which will be referred to as mask 250, which is the same as the one shown in FIGS. 5A-6B and 11, and mask 250' respectively. Both have two opposing surfaces. A first surface 255 faces radiation sources 520, and the second surface 256 (not visible) faces the wafer 20 to be processed. Side 257, 257', which extends about the periphery of masks 250 and 250' respectively, connects the two surfaces. First surface 255 may be appropriately polished to reflect away radiation and minimize heat-raising absorption. In exemplary mask 250, shown in FIG. 12A, side 257 of mask 250 is square to both surfaces 255 and 256. With this arrangement it may be necessary to carefully smooth the side 257 of mask 250 significantly to provide a sufficiently well defined (i.e., sharp) shadow line. Exemplary mask 250' mask, shown in FIG. 12B, has a slanted side 257' which forms an acute angle (akin to the edge of a wood chisel or plane iron) with wafer facing surface 256. With this arrangement a sharp shadow line may more readily be provided.

Still another embodiment of the present invention is illustrated in FIGS. 13A-14B. This embodiment differs from the previously described embodiments of FIGS. 5A-7B primarily in the mask that is used and the means of its attachment to radiation unit 2000'. In particular enclosure 210, internal electronics and cooling mechanisms, heat sink 212, printed circuit boards 510, and radiation sources or LED units 520 may all be of the same designs, types and numbers as previously described with respect to FIGS. 5A-6B. Furthermore, operation may be the same as previously described.

Mask 260 used in FIGS. 13A-14B differs from mask 250 used in FIGS. 5A-6B. Rather than being an opaque disk as is mask 250, mask 260 is produced in a similar manner as other masks used in the semiconductor fabrication process. Thus, mask 260 may be produced by standard, commercial mask-making facilities or services, which are known to be capable of producing masks suitable for forming geometric features to accuracies of tens of nanometers in the fabrication of semiconductor chips.

Figure 15:
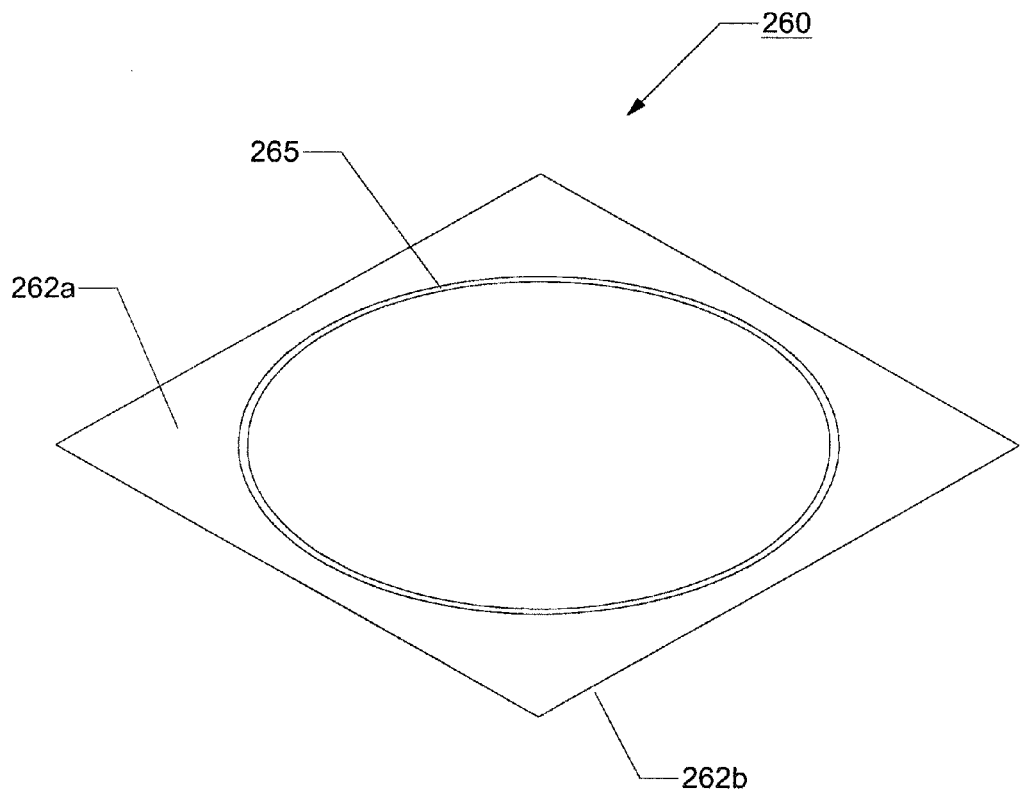
FIG. 15 is a perspective view of the mask incorporated in the exemplary radiation unit of FIGS. 13A through 14B.

FIG. 15 provides a perspective view of rectangular (or square)-shaped mask 260, which is made from fused quartz. An exemplary mask 260 is approximately three mm thick and has two parallel surfaces 262a and 262b. Surface 262a is chrome plated, providing an opaque, reflective surface. Chrome plating is not present along track 265, which provides a transparent stripe through which radiation may pass. Track 265 is typically formed in commercially available mask making process by suitable techniques such as photolithography. In an exemplary mask, track 265 is circular and preferably has an inner diameter calculated in the same manner as the diameter of disk-shaped mask 250 in the previously described embodiments. That is, the diameter would be D−2W, where D is the diameter of the wafers to be processed and W is the maximum width of the edge bead as before. In an exemplary embodiment of a mask 260 used in conjunction with 200 mm diameter wafers, the inner diameter is 195 mm, allowing for an edge bead maximum width of 2.5 mm. The outer diameter of track 265 should preferably be at least a few millimeters greater than the diameter D of the wafers to be processed. In the exemplary embodiment just mentioned, for example, the outer diameter may be 205 mm, resulting in a track width of 5 mm.

As with previously described mask 250, present mask 260 is positioned parallel with heat sink 212 and close to but not touching the outer lens tops 523 of LED units 520. Also, mask 260 is positioned with unplated surface 262b facing heat sink 212 and LED units 520 and with chrome-plated surface 262a facing outwards towards the wafer to be processed. Finally, the center of mask 260 should preferably be aligned with the center of the circle of LED units 520 so that the two circles are concentric. In an exemplary embodiment chrome-plated surface 262a is fixed at a distance of approximately 3½ mm from lens tops 523 of LED units 520.

Exemplary apparatus for positioning and holding mask 260 in place is illustrated in FIGS. 13A-14B, which will now be described. Mask 260 fits closely within mask frame 270 and is held securely therein with clamping bars 271 which are fastened to frame 270 with suitable screws 272. Mask frame 270 is of an overall size that is slightly larger than a square or rectangle that circumscribes the area occupied by printed circuit boards 510.

Two brackets 275 are attached to heat sink 212, also with appropriate fasteners (not shown). Brackets 275 are located outside of the area occupied by printed circuit boards 510, are arranged parallel to one another, and are spaced a distance apart that allows mask frame 270 to slide closely between them. Brackets 275 include retaining lips 277 which extend toward printed circuit boards 510 and which are of a size to prevent mask frame 270 from falling or otherwise moving substantially away from heat sink 510. In other words, due to lips 277, frame 270 may be moved between brackets 275 in a direction mutually parallel to heat sink 212 and brackets 275 without a substantial risk of falling away from heat sink 212.

For aligning, planarizing, and spacing mask frame 270 with respect to heat sink 212, four stepped spacers 280 are attached to heat sink 212; and corresponding holes 279 are included at the corners of mask frame 270. Stepped spacers 280 have base portion 281, shoulder 282, and guide portion 283. Guide portion 283 is of a diameter that provides a close fit with its respective frame hole 279. Spacers 280 are disposed on heat sink 212 so as to receive and position frame 270 as desired with respect to LED units 520. That is, frame 270 may be slid between brackets 275 and maneuvered to a position where its holes 279 are aligned with the guide portions 283 of their respective stepped spacers 280. Mask frame 270 may then be urged towards heat sink 212 with guide portions 283 entering respective, closely fitting holes 279, providing the desired final alignment. Pressing mask frame 270 against shoulders 282 of stepped spacers 280 establishes its planarity with and the desired distance away from heat sink 212. Shoulder screws 290 are incorporated to secure mask frame 270 in place. In particular guide portions 283 of stepped spacers 280 include an axial tapped hole 284 for receiving the threaded portion 291 of its respective shoulder screw 290, and the shoulder 292 of each shoulder screw 290 is larger in diameter (else flat washers may be used) than its respective hole 279 in frame 270. Thus, shoulder screws 290 may be inserted and tightened so that their shoulders bear against frame 270 and press it firmly against the shoulders 282 of the stepped spacers 280. Accordingly, mask frame 270 and mask 260 are securely fastened in the desired position. For convenience knobs 295 may be incorporated with each shoulder screw 290 so that tools are not necessary to remove or install a mask. Finally, it may be pointed out that brackets 275 are of a sufficient height to allow mask frame 270 to be moved comfortably between lip portions 277 and the distal ends of stepped spacers 280.

It should be noted that due to the positioning of mask 260 relative to LED units 520, the lines or rays of radiation that strike track 265 are substantially perpendicular to surface 262a. Thus, with the angle of incidence being essentially, or close to, 90 degrees there is negligible bending or distortion of the rays due to refraction. Should circumstances dictate a more acute angle of incidence then refraction effects should preferably be taken into account in the design of mask 260 and track 265. This may be accomplished by applying well-known ray tracing techniques and Snell's law.

Figure 13A:
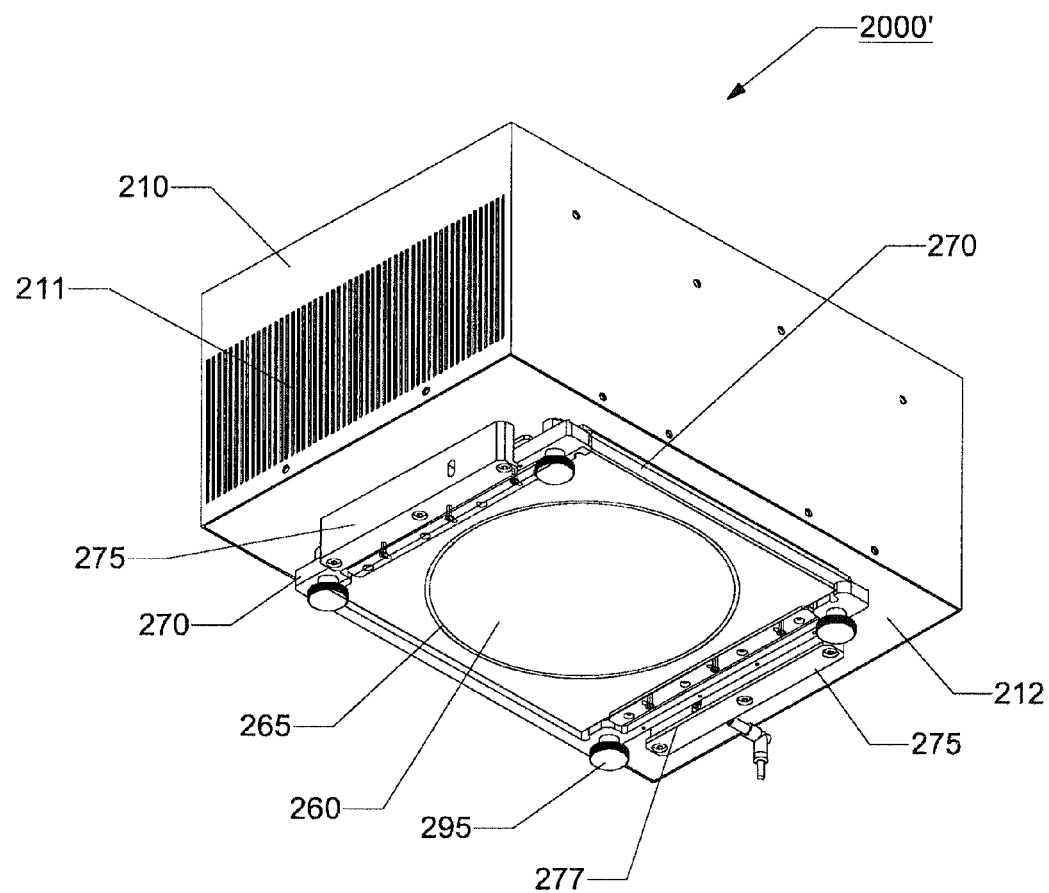
FIG. 13A is a perspective view of another exemplary radiation unit which incorporates the invention, which has a mask of a different type than that of the unit of FIGS. 5A through 6B.
Figure 13B:
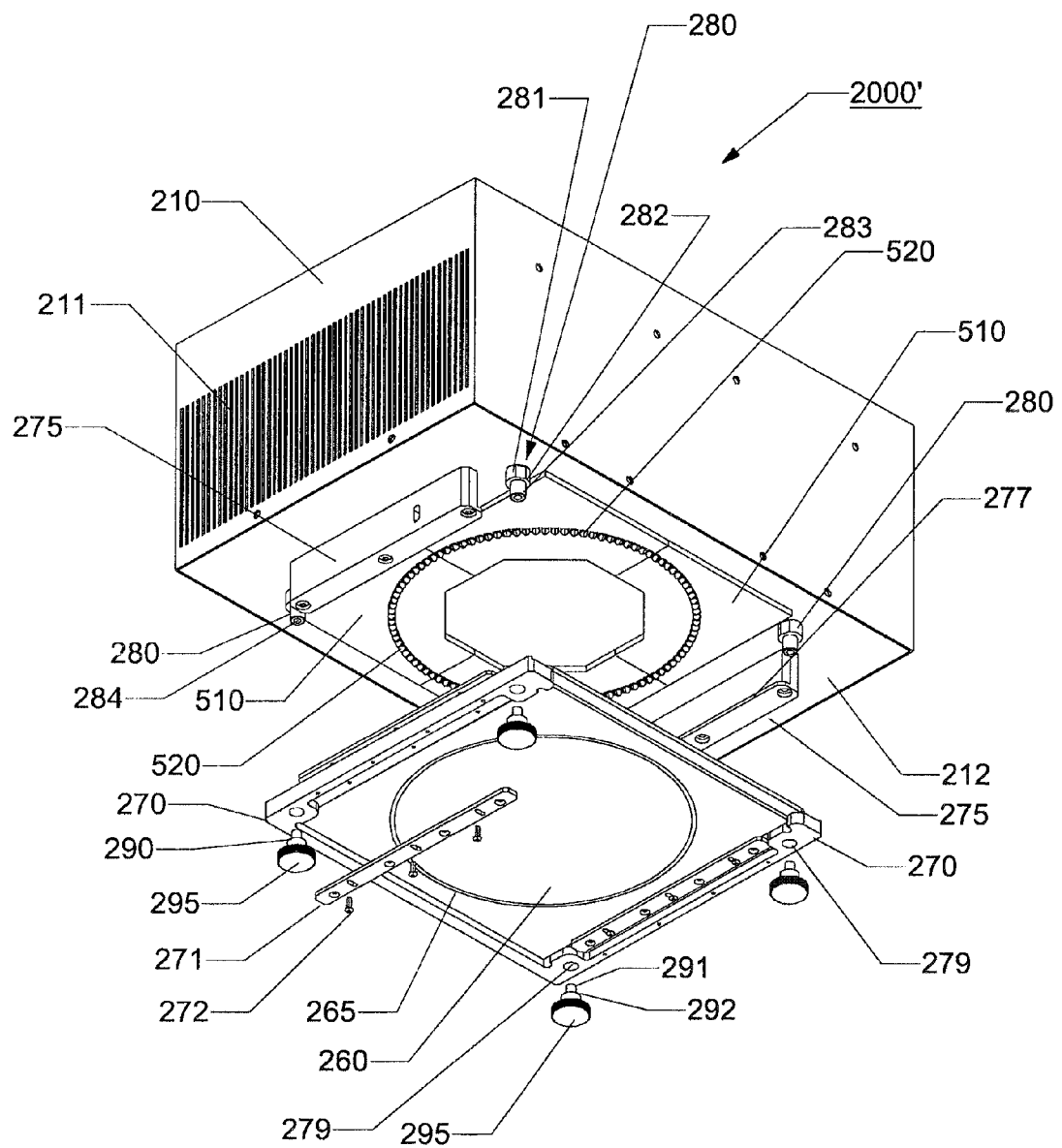
FIG. 13B is a partially exploded view of FIG. 13A.
Figure 14A:
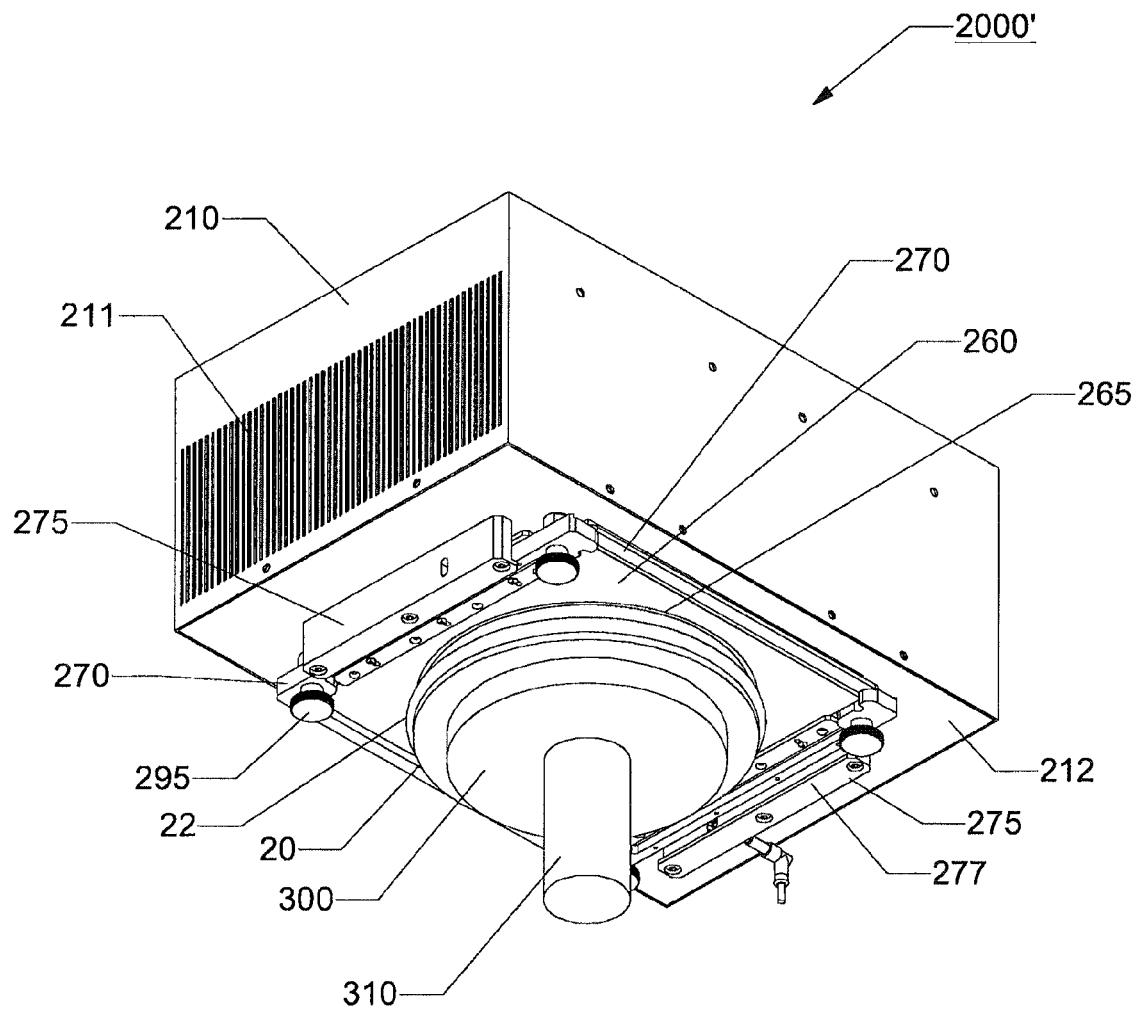
FIG. 14A is a perspective view of the exemplary radiation unit of FIG. 13A together with a wafer held in position for exposure of its edge to radiation.
Figure 14B:
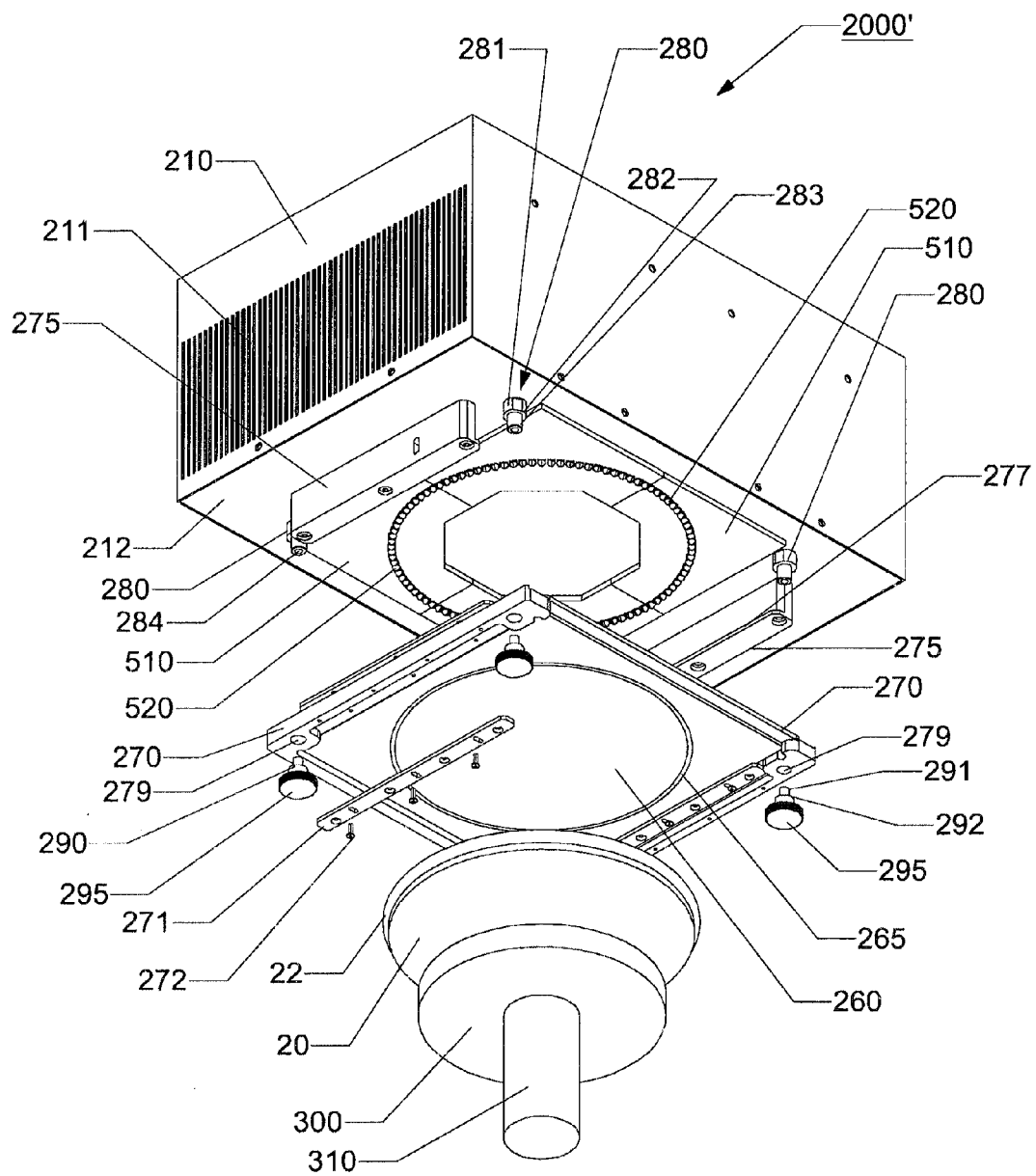
FIG. 14B is a partially exploded view of FIG. 14A.

FIGS. 14A and 14B provide perspective and exploded perspective views of a wafer 20 having edge bead 22 held in position by chuck 300 for treatment by the exemplary radiation unit 2000' of FIGS. 13A and 13B. Preferably, wafer 20 is positioned so as to be parallel to mask 250 and so that the center of wafer 20 is aligned with the center of mask 260. In other words wafer 20 is planarized and centered with respect to mask 260. It is also preferable that the wafer 20 to be treated is brought into close proximity to mask 260. Typically, when positioned, the spacing between wafer 20 and mask 260 is approximately five to ten mm.

Once positioned as described above, the LED units 520 may be turned on, applying the desired radiation to the edge bead 22. Mask 260, as previously discussed, prevents radiation from reaching areas of the wafer 20 that are interior to edge bead 22. In other words mask 260 places the region of the wafer that is interior to the edge bead in a protective shadow. When sufficient radiation has been applied to cause the desired effect, LED units 520 may be turned off and wafer 20 may be removed from position and placed at a desired destination. In an exemplary embodiment an exposure time of less than 30 seconds was found to be adequate.

In a further alternative embodiment of the invention, multiple sources of radiation emit light towards an edge of mask 250 and towards the portion of the wafer which is not blocked by the mask. The wafer is then spun (on a turntable, for example) so that radiation from the one or more sources of radiation is applied uniformly to the portion of the wafer that is not blocked by mask 250. To put it another way, in the first exemplary embodiment, a plurality of sources of radiation may (but may not) apply uniform radiation simultaneously to all areas of the wafer that are not blocked by mask 250. In this further alternative embodiment, radiation is applied to the wafer from more than one source of radiation emission (or applied after being emitted from more than one location), but there are other areas of the wafer that are not simultaneously receiving radiation. Thus, the wafer is spun so that areas of the wafer that initially did not receive radiation can subsequently receive radiation and so that radiation can be uniformly applied to areas of the wafer not blocked by mask 250.

The multiple sources of emission are desirably at distinct locations.

Although four printed circuit boards 510 are shown in the previously described exemplary embodiments, it is feasible that the desired line of LED units 520 may be realized on any number of printed circuit boards. Indeed exemplary embodiments having from one to as many as eight or more circuit boards have been considered. The final choice is a matter of manufacturing and service costs and convenience.

Figure 1B:
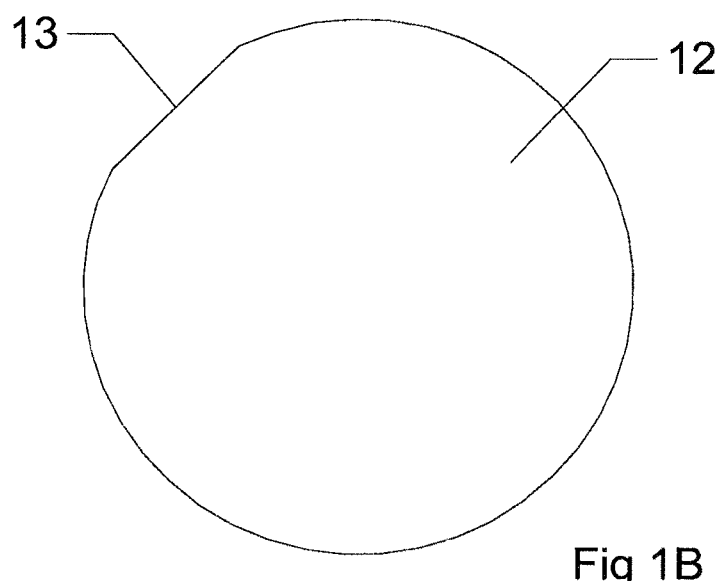
FIG. 1B is a plan view of a wafer having a flat section in its perimeter edge.

Although the previously described exemplary embodiments have addressed situations where the path of radiation to be applied follows a circular periphery of a wafer, it will be obvious to those of ordinary skill that the technique of using a sequence of individual radiation units may be applied to other shapes including, but not necessarily limited to the periphery of wafers having a flat portion on their boundaries such as indexing flat 13 on wafer 12 of FIG. 1B. Also it should be clear to those of reasonable skill that the invention is not limited to wafers of any particular size. Indeed, exemplary systems incorporating the invention for treating wafers of a number of different diameters have been considered. It is thus desirable to dispose radiation units along a non-linear path. The radiation units may be, for example, of the same general size and shape as the path on the wafer to be treated. Further a mask which also is the shape of the wafer (but which may or may not be smaller than the wafer) may be provided to prevent the applied radiation from undesirably affecting portions of the wafer which are not to be treated. Thus, although illustrated and described herein with reference to certain specific embodiments, the present invention is nevertheless not intended to be limited to the details shown. Rather, various modifications may be made in the details within the scope and range of equivalence of the claims and without departing from the spirit of the invention.

The invention claimed is:

1. Apparatus for irradiating, said apparatus comprising:
 a plurality of radiation emitters arranged along a non-linear path along a common plane and from which electromagnetic radiation is emitted so that the electromagnetic radiation is directed away from the common plane; and
 a mask which permits a portion of said electromagnetic radiation from said plurality of radiation emitters to pass and which blocks a further portion of said electromagnetic radiation from said plurality of radiation emitters from passing
 wherein said portion of said electromagnetic radiation is transmitted past said mask along an outer edge of said mask.

2. Apparatus for irradiating according to claim 1, wherein said portion of electromagnetic radiation from said plurality of radiation emitters which passes said mask overlaps.

3. Apparatus for irradiating according to claim 1, wherein each of said radiation emitters emitting electromagnetic radiation are blocked from passing said mask by respectively different portions of said mask.

4. Apparatus for irradiating according to claim 1, wherein each of said radiation emitters emits radiation with a cone-like shape.

5. Apparatus for irradiating according to claim 1, further comprising a support system for supporting a wafer, wherein said portion of said electromagnetic radiation which passes said mask from said plurality of radiation emitters radiates a continuous portion of said wafer.

6. Apparatus for irradiating according to claim 1, wherein said plurality of radiation emitters are each a semiconductor device.

7. Apparatus for irradiating according to claim 1, wherein said plurality of radiation emitters are a plurality of sources of electromagnetic radiation which are equally spaced from each other.

8. Apparatus for irradiating according to claim 1, further comprising a turntable for turning an object which is irradiated by said portion of said electromagnetic radiation.

9. Apparatus for irradiating according to claim 1, wherein said mask is parallel to said plane.

10. Apparatus for irradiating according to claim 1 wherein said plurality of radiation emitters are located in respectively different locations and project electromagnetic radiation below said mask and towards a respective plurality of destination locations that have a distance therebetween.

11. A method of irradiating, said method comprising the steps of:
 permitting a portion of electromagnetic radiation to pass from a plurality of locations arranged along a non-linear path along a common plane and from which the electromagnetic radiation is emitted so that the electromagnetic radiation is directed away from the common plane; and
 preventing a further electromagnetic radiation to pass from said plurality of locations by using a mask
 wherein said portion of electromagnetic radiation is transmitted past said mask along an outer edge of said mask.

12. A method of irradiating according to claim 11, wherein said portion of electromagnetic radiation from said plurality of radiation emitters which passes said mask overlaps.

13. A method of irradiating according to claim 11, wherein said electromagnetic radiation is emitted by a plurality of light sources and said mask prevents said electromagnetic radiation from passing at a plurality of respectively different locations.

14. A method of irradiating according to claim 11, wherein said radiation from each of said locations is emitted with a cone-like shape.

15. A method of irradiating according to claim 11, wherein said portion of said electromagnetic radiation which passes said mask radiates a portion of a wafer.

16. A method of irradiating according to claim 11, wherein said mask and said wafer have the same shape.

17. A method of irradiating according to claim 11, wherein said electromagnetic radiation is emitted by a plurality of semiconductor devices.

18. A method of irradiating according to claim 11, wherein said wafer is rotated while said electromagnetic radiation which passes said mask radiates said wafer.

19. A method of irradiating according to claim 11, wherein said mask is parallel to said plane.

20. Apparatus for irradiating, said apparatus comprising:
 at least one radiation emitter that emits electromagnetic radiation from a plurality of locations that are along a non-linear path and along a common plan so that the electromagnetic radiation is directed away from the common plane;

a mask that permits a portion of said electromagnetic radiation from said at least one radiation emitter to pass and that blocks a further portion of said electromagnetic radiation from said at least one radiation emitter from passing;

wherein said portion of said electromagnetic radiation is transmitted past said mask along an outer edge of said mask.

21. Apparatus for irradiating according to claim 20, wherein said at least one radiation emitter projects electromagnetic radiation below said mask and towards a plurality of destination locations that have a distance therebetween.

* * * * *